(12) United States Patent
Ueda et al.

(10) Patent No.: US 9,312,264 B2
(45) Date of Patent: Apr. 12, 2016

(54) NON-VOLATILE MEMORY DEVICE

(71) Applicant: Sharp Kabushiki Kaisha, Osaka-shi, Osaka (JP)

(72) Inventors: Naoki Ueda, Osaka (JP); Sumio Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/434,148

(22) PCT Filed: Oct. 15, 2013

(86) PCT No.: PCT/JP2013/077908
§ 371 (c)(1),
(2) Date: Apr. 8, 2015

(87) PCT Pub. No.: WO2014/061633
PCT Pub. Date: Apr. 24, 2014

(65) Prior Publication Data
US 2015/0243668 A1 Aug. 27, 2015

(30) Foreign Application Priority Data
Oct. 19, 2012 (JP) .................................. 2012-231480

(51) Int. Cl.
H01L 23/62 (2006.01)
H01L 27/112 (2006.01)
H01L 27/10 (2006.01)
G11C 13/00 (2006.01)

(52) U.S. Cl.
CPC ........ H01L 27/11206 (2013.01); G11C 13/003 (2013.01); G11C 13/0007 (2013.01); H01L27/101 (2013.01); G11C 13/0069 (2013.01); G11C 2213/53 (2013.01); G11C 2213/74 (2013.01); G11C 2213/79 (2013.01)

(58) Field of Classification Search
CPC ............ H01L 21/8238; H01L 21/8229; H01L 21/048; H01L 21/3141; H01L 21/28294; H01L 21/76264; H01L 21/02255; H01L 27/0251; H01L 27/1251; H01L 27/3248; H01L 27/0922; H01L 27/11514; H01L 29/7816; H01L 29/7869; H01L 29/4908; H01L 51/0508; H01L 51/102
USPC .......... 257/69, 200, 201, 204, 288, 296, 310, 257/322, 347, 359, 396, 774, E21.006, 257/E21.077, E21.126, E21.127, E21.17, 257/E21.267, E21.277, E21.32, E21.324, 257/E21.37, E21.411, E21.613
See application file for complete search history.

(56) References Cited

U.S. PATENT DOCUMENTS

| | | | | |
|---|---|---|---|---|
| 6,788,573 B2* | 9/2004 | Choi | ................ | G11C 16/0433 257/315 |
| 7,009,888 B2* | 3/2006 | Masuoka | ........... | G11C 16/0433 365/185.28 |
| 8,493,787 B2* | 7/2013 | Pasotti | ............... | G11C 16/0441 365/185.18 |
| 8,530,956 B2* | 9/2013 | Lee | ................... | H01L 27/11565 257/324 |
| 8,619,469 B2* | 12/2013 | Pasotti | ............... | G11C 16/0433 365/185.1 |
| 2009/0179302 A1 | 7/2009 | Kothandaraman et al. | | |

FOREIGN PATENT DOCUMENTS

JP 2010-262711 A 11/2010

OTHER PUBLICATIONS

Safran et al., "A Compact eFUSE Programmable Array Memory for SOI CMOS," 2007 Symposium on VLSI Circuits Digest of Technical Papers, pp. 72-73.

* cited by examiner

*Primary Examiner* — David Nhu
(74) *Attorney, Agent, or Firm* — Keating & Bennett, LLP

(57) ABSTRACT

The present invention provides a non-volatile memory device using a memory transistor including an oxide semiconductor, capable of writing with low power consumption, without receiving an influence of deterioration of a selection transistor connected in series to the memory transistor. A memory cell 1 includes a memory transistor Qm, and first and second selection transistors Q1 and Q2. During a writing operation, the memory transistor Qm and the first selection transistor Q1 are set to the ON state, and the second selection transistor Q2 is set to the OFF state. A writing current is flown to a series circuit of the memory transistor Qm and the first selection transistor Q1. The memory transistor Qm is transited from a first state that indicates a transistor characteristic to a second state that indicates an ohmic resistance characteristic. During a reading operation, the first selection transistor Q1 is set to the OFF state, the second selection transistor Q2 is set to the ON state, a voltage is applied to a series circuit of the memory transistor Qm and the second selection transistor Q2, and it is detected whether the memory transistor Qm is in the first state or the second state.

15 Claims, 27 Drawing Sheets

| Mode | Terminal | | | | | |
|---|---|---|---|---|---|---|
| | N0 | N1, N2 | NC0 | NC1 | NC2 | N3 |
| Inverter | Vdd (Vdr) | Vss (0V) | Vdd | Vss (0V) | VLin (Low Level) | VHout (High Level) |
| | | | | | VHin (High Level) | VLout (Low Level) |
| Memory Program (Writing Operation) | Vdp | Vss (0V) | Vgp1 | Vgp2 | Vss | / |
| Memory Program (Writing Non-Operation) | | | | Vss (0V) | | |
| ROM (First State) | Vdd (Vdr) | Vss (0V) | Vss (0V) | Vss (0V) | Vgr | Vout1 (Low Level) |
| ROM (Second State) | | | | | | Vout2 (High Level) |

Fig. 22

NON-VOLATILE MEMORY DEVICE

CROSS-REFERENCE TO RELATED APPLICATIONS

This application is a National Phase filing under 35 U.S.C. §371 of International Application No. PCT/JP2013/077908 filed on Oct. 15, 2013, and which claims priority to Japanese Patent Application No. 2012-231480 filed on Oct. 19, 2012.

TECHNICAL FIELD

The present invention relates to a non-volatile memory device including a memory cell capable of holding information in a non-volatile manner, and particularly to a non-volatile memory device that stores information by flowing a current to the memory transistors configuring the memory cells and by changing current/voltage characteristics of memory transistors.

BACKGROUND ART

Currently, eFUSE (electric fuse) type elements which are described in the following Patent Documents 1 and 2 and Non-patent Document 1 have been known as a memory element that can be utilized as a ROM (Read Only Memory).

Each of the eFUSE type memory elements described in Patent Document 1 and Non-patent Document 1 includes memory cells connected in series to a selection transistor. At a writing operation time, the selection transistor is set to a conducting state in a selected memory cell, a large current is flown to the memory element, and a current/voltage characteristic of the memory element is changed from a resistance characteristic of low resistance to an insulation state by fusing the memory element, and writing of binary data is performed.

In the memory cells described in Patent Document 1, a terminal, which is not connected to the selection transistor, of the memory element is connected in common to a first voltage supply line. A terminal, which is not connected to the memory element, of the selection transistor is connected in common to a second voltage supply line. A second transistor that is brought into a conducting state at a writing operation time of the memory element is connected to a second voltage supply line so that a writing circuit is formed. There is formed a writing current path that passes from the first voltage supply line via the memory cell as a target of writing and the second transistor. A large current flows in the memory element so that writing of the memory element is executed.

In the memory cells described in Non-patent Document 1, a terminal which is not connected to the selection transistor, of the memory element is connected in common to a bit line. A terminal, which is not connected to the memory element, of the selection transistor is grounded. A second transistor that is brought into a conducting state at a writing operation time of the memory element is connected to the bit line so that a writing circuit is formed. There is formed a writing current path that passes from the second transistor via the bit line and the memory cell as a target of writing. A large current flows in the memory element so that writing of the memory element is executed.

The memory element described in Patent Document 2 is configured as a resistance element including a lamination structure of polysilicon/silicide/silicon nitride films that is the same as a wiring structure employed in a normal logic LSI process with two terminals of a cathode and an anode. A large current flows in the resistance element for heating, an atom of a material for a metal wire is migrated or melted in a direction of an electron flow to cause breakdown, and then a resistance value between two terminals is changed. In Patent Document 2, an example of configuring the memory element as a memory cell is not disclosed. However, two MOS transistors are connected in series to the memory element, and a large current is configured to be flown at the writing time via the MOS transistor.

PRIOR ART DOCUMENTS

Patent Documents

Patent Document 1: Japanese Patent Application Publication NO. 2010-262711
Patent Document 2: US 2009/0179302 A

Non-Patent Document

Non-patent Document 1: J. Safran, et al., "A Compact eFUSE Programmable Array Memory for SOI CMOS", IEEE, 2007 Symposium on VLSI Circuit of Technical Papers, pp. 72-73.

SUMMARY OF THE INVENTION

Problems to be Solved by the Invention

The eFUSE type memory elements described in Patent Documents 1 and 2 and Non-patent Document 1 is fused by allowing a large current to flow. Therefore, the same large current flows to the selection transistor connected in series to the memory element at the writing operation time.

Further, in the reading operation of deciding whether the memory element is in the state before writing or in the state after writing, the state of the current that flows in the memory element is decided by setting the selection transistor to a conducting state, and in the state that a predetermined voltage is applied to both ends of the memory element.

As described above, the selection transistor connected in series to the memory element as a target of the writing operation or the reading operation is brought into the conducting state both at the writing operation time and the reading operation time. In this case, flowing a large current to the memory element at the writing operation time has a risk of deteriorating the selection transistor because the same large current also flows to the selection transistor.

Since the fuse material is melted and broken by being heated to a high temperature, the eFUSE memory element has a risk of scattering the melted material and deforming the adjacent materials by heating the memory element. Consequently, a high-density circuit cannot be arranged around the element, which becomes a cause of increasing a chip size in the case of configuring a non-volatile memory device.

In the mean time, the inventors of the present application have found, as a result of in-depth studies, that as a memory element in which a current/voltage characteristic changes with low power consumption by taking place the eFUSE type memory element, there can be utilized an oxide semiconductor transistor having a general MOS transistor structure in which a source region, a drain region, and a channel region are composed of a metal oxide semiconductor. More specifically, it has been confirmed that the oxide semiconductor transistor can transit from a first state in which the transistor operates as a normal transistor in the initial state, that is, the current/voltage characteristic between the source and the drain changes depending on the gate voltage to a second state in which the current/voltage characteristic between the source and the drain indicates an ohmic resistance characteristic without depending on the gate voltage by flowing a current between the source and the drain under a predetermined condition.

Therefore, by utilizing the oxide semiconductor transistor as a memory element, there can be provided a non-volatile memory device capable of performing, as compared with the eFUSE type memory element, a writing operation with low power consumption by suppressing a current which flows in the memory element at a writing operation time.

While a mechanism of the state transition of the oxide semiconductor transistor is currently under study, the above state transition is considered to occur based on a change in a configuration proportion of elements configuring the metal oxide semiconductor in the channel region, by Joule heat generated by a current flowing between the source region and the drain region of the above transistor structure. Particularly, by Joule heat generated by the current flowing in the channel region, diffusion of a constituent element (oxygen, for example) in the metal oxide semiconductor constituting the channel region is induced. As a result of the diffusing of the constituent substance to outside of the channel region, a stoichiometric composition of the metal oxide semiconductor in the channel region is considered to change and lower the resistance.

In the case of the eFUSE type memory element, an insulation state results after the writing. Therefore, even when a selection transistor has deteriorated and a similar insulation state occurs, an influence of the selection transistor, although deteriorated, to the reading operation of the memory element in the written state is considered small. Further, because a large current does not flow to the selection transistor connected in series to the memory element not yet written, deterioration of the selection transistor corresponding to the writing operation can be avoided. Therefore, similarly, the influence to the reading operation is considered small.

However, in the case of using the oxide semiconductor transistor as a memory element, the memory element is not brought into the insulation state after the writing operation, and is brought into the low resistance state oppositely to the eFUSE type memory element. Accordingly, when a variation in the current/voltage characteristic has occurred due to deterioration of the selection transistor by the current flowing at the writing operation time, in appearance, the variation appears as a variation of the current/voltage characteristic of a low-resistance memory element after the writing. Therefore, there is a risk of the influence of reduction in the reading operation margin and the like.

Further, as described above, when the state transition of the oxide semiconductor transistor has been induced by the Joule heat generated by the current flowing at the writing operation time, an attempt to suppress the current flowing in the selection transistor and the memory element in order to suppress the deterioration of the selection transistor results in insufficient transmission of power to the memory element and thus suppression of the state transition. This has a risk of lowering the writing performance such as a writing speed.

The present invention has been made in view of the above problems. An object of the present invention is to provide a non-volatile memory device using a memory transistor including an oxide semiconductor, capable of writing with low power consumption, without receiving an influence of deterioration of a selection transistor connected in series to the memory transistor.

Means for Solving the Problem

In order to achieve the above object, according to a first aspect, a non-volatile memory device of the present invention comprises one or more memory cells, wherein each of the memory cells comprises a memory transistor, a first selection transistor, and a second selection transistor, and a source or a drain of the memory transistor, a source or a drain of the first selection transistor, and a source or a drain of the second selection transistor are electrically connected to one another to form an internal node of each memory cell, the memory transistor comprises a transistor structure having a gate electrode, a source region, a drain region, and a channel region, each region being composed of an oxide semiconductor, the memory transistor holds in a non-volatile manner any one of a first state in which a current/voltage characteristic between the source region and the drain region changes depending on a voltage application state of the gate electrode and a second state in which a current/voltage characteristic between the source region and the drain region indicates an ohmic resistance characteristic regardless of a voltage application state of the gate electrode, and the memory transistor has a state transition characteristic which transits from the first state to the second state depending on a current flowing between the source and the drain, the non-volatile memory device is configured so that at a writing operation time of transiting the memory transistor from the first state to the second state, a conducting state is set between the source and the drain of the first selection transistor, a non-conducting state is set between the source and the drain of the second selection transistor, and a writing current flows in the memory transistor and the first selection transistor, and the non-volatile memory device is configured so that at a reading operation time of detecting whether the memory transistor is in the first state or the second state, a non-conducting state is set between the source and the drain of the first selection transistor, a conducting state is set between the source and the drain of the second selection transistor, and a reading voltage is applied between the source and the drain of the memory transistor.

According to a second aspect, in the non-volatile memory device according to the first aspect, at least one of the first selection transistor and the second selection transistor comprises the same transistor structure as that of the memory transistor.

According to a third aspect, in the non-volatile memory device according to the first or second aspect, transition from the first state to the second state occurs based on a change in a configuration proportion of elements that configure the metal oxide semiconductor of the channel region by Joule heat generated by a current flowing between the source region and the drain region of the memory transistor.

Further, in the non-volatile memory device according to any of the above aspects, it is preferable that, at the writing operation time, a voltage between the source and the drain of the memory transistor is larger than a voltage between the source and the drain of the first selection transistor.

Further, in the non-volatile memory device according to any of the above aspects, preferably, the metal oxide semiconductor is formed by containing In, Ga or Zn element, and more preferably, comprising InGaZnOx.

Further, in the non-volatile memory device according to any of the above aspects, preferably, the memory transistor and the first and second selection transistors are thin-film transistors.

Further, in the non-volatile memory device according to any of the above aspects, preferably, the first and second selection transistors comprise the same transistor structures as that of the memory transistor, and are fixed to the first state.

Further, in the non-volatile memory device according to any of the above aspects, it is preferable that, at the reading operation time, a voltage applied to the gate electrode of the memory transistor is set such that a current that flows between the source region and the drain region in a case of the memory transistor being in the first state is smaller than a current that flows between the source region and the drain region in a case of the memory transistor being in the second state.

Further, in the non-volatile memory device according to any of the above aspects, preferably, in the memory cell in which the memory transistor is in the first state, a conducting state is set between the source and the drain of the memory transistor, a non-conducting state is set between the source and the drain of the first selection transistor, and an output voltage corresponding to a voltage applied to a gate electrode of the second selection transistor is output from the internal node.

According to a fourth aspect, the non-volatile memory device according to any of the above aspects further comprises a memory cell array including a plurality of the memory cells arranged in at least a column direction of a row direction and the column direction, and in each of the plurality of the memory cells arranged on the same column, the source or drain, which is not connected to the first and second selection transistors, of the memory transistor is connected in common to a data signal line extending in the column direction, the source or drain, which is not connected to the memory transistor, of the first selection transistor is connected to a first reference voltage line, and the source or drain, which is not connected to the memory transistor, of the second selection transistor is connected to a second reference voltage line.

According to a fifth aspect, the non-volatile memory device according to any of the above aspects further comprises a memory cell array including a plurality of the memory cells arranged in at least a row direction of the row direction and the column direction, and in each of the plurality of the memory cells arranged on the same row, the gate electrode of the memory transistor is connected in common to a first control line extending in the row direction, the gate electrode of the first selection transistor is connected in common to a second control line extending in the row direction, the gate electrode of the second selection transistor is connected in common to a third control line extending in the row direction, the source or drain, which is not connected to the memory transistor, of the first selection transistor is connected in common to a first reference voltage line, and the source or drain, which is not connected to the memory transistor, of the second selection transistor is connected in common to a second reference voltage line.

According to a sixth aspect, in the non-volatile memory device according to the fourth or fifth aspect, the first control lines of respective rows are connected to each other.

According to a seventh aspect, in the non-volatile memory device according to the fourth aspect, the first control lines of respective rows are connected to each other, and the third control lines of respective rows are connected to each other.

According to an eighth aspect, in the non-volatile memory device according to the fifth aspect, the first control line and the second control line connected to the memory cells of the same row are same control signal line.

According to a ninth aspect, in the non-volatile memory device according to any of the fourth to eighth aspects, the first reference voltage line and the second reference voltage line are the same reference voltage line.

Effects of the Invention

According to the non-volatile memory device of the first aspect, since the writing current flows to the first selection transistor at the writing operation time, even when the first selection transistor has deteriorated and the current/voltage characteristic has varied, for example, even when the ON current and the like have varied, the second selection transistor does not generate such deterioration because the second selection transistor is in the non-conducting state and a current does not flow. Therefore, at the reading operation time, instead of using the first selection transistor having a possibility of deterioration, by using a not-deteriorated second selection transistor, a reading operation with no influence of deterioration of the first selection transistor becomes possible. As a result, reduction in the reading operation margin due to the deterioration of the first selection transistor can be prevented.

BRIEF DESCRIPTION OF THE DRAWINGS

FIG. 22 is a table of voltage application states in the inverter mode, the memory program mode, and the ROM mode to the circuit cell illustrated in FIG. 20 and an output level of an output terminal.

DESCRIPTION OF EMBODIMENTS

Figure 1:
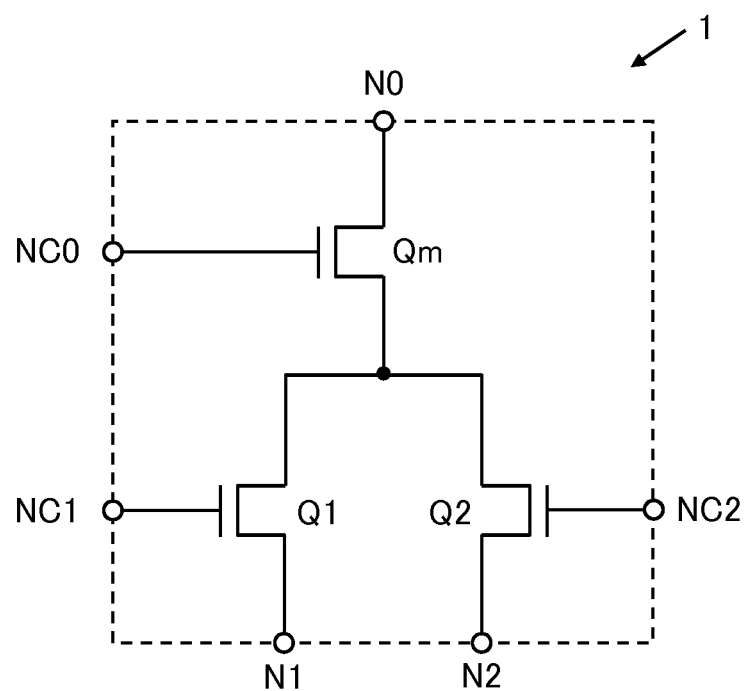
FIG. 1 is an equivalent circuit diagram of a memory cell configuring a non-volatile memory device according to the present invention.

Hereinafter, a non-volatile memory device (hereinafter, appropriately referred to as "the present memory device") according to embodiments of the present invention will be described in detail with reference to the drawings. In the drawings illustrating an element structure, for convenience of description, key parts will be emphasized, and size ratios of each part of the elements and actual size ratios do not necessarily match.

First Embodiment

FIG. 1 illustrates an equivalent circuit of a memory cell used in the present memory device. A memory cell 1 includes a memory transistor Qm, a first selection transistor Q1, and a second selection transistor Q2. In the present embodiment, each of the transistors Qm, Q1, and Q2 is an re-channel type thin-film transistor (TFT) having the same transistor structure. As illustrated in FIG. 1, the memory cell 1 includes three nodes N0, N1, and N2, three control nodes NC0, NC1, and NC2, and an internal node N3. The source of the memory transistor Qm and each drain of the first and second selection transistors Q1 and Q2 are connected to one another to form the internal node N3. The drain of the memory transistor Qm configures the node N0, the source of the first selection transistor Q1 configures the node N1, and the source of the second selection transistor Q2 configures the node N2. The gates of the transistors Qm, Q1, and Q2 configure the control nodes NC0, NC1, and NC2, respectively.

Figure 2:
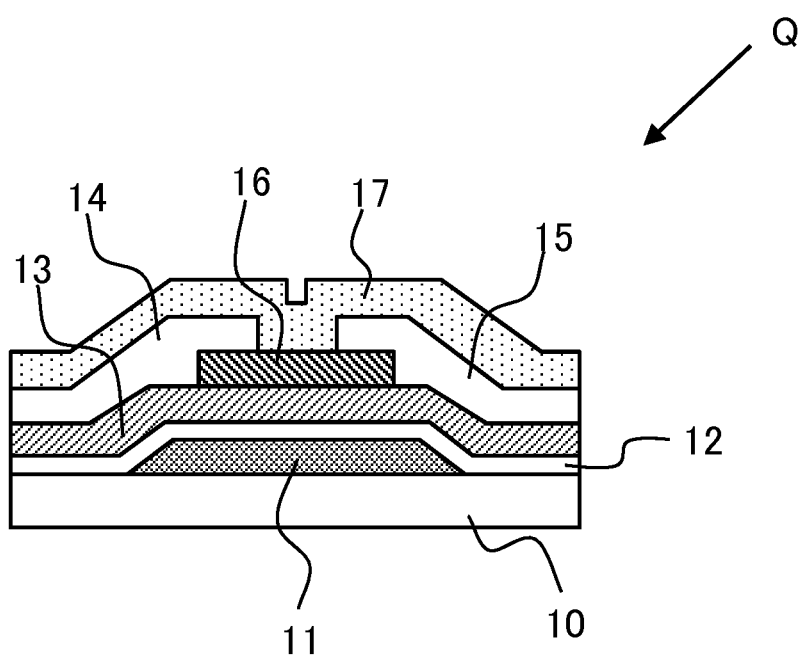
FIG. 2 is a sectional view schematically illustrating an element structure of a transistor which configures the memory cell illustrated in FIG. 1.
Figure 3:
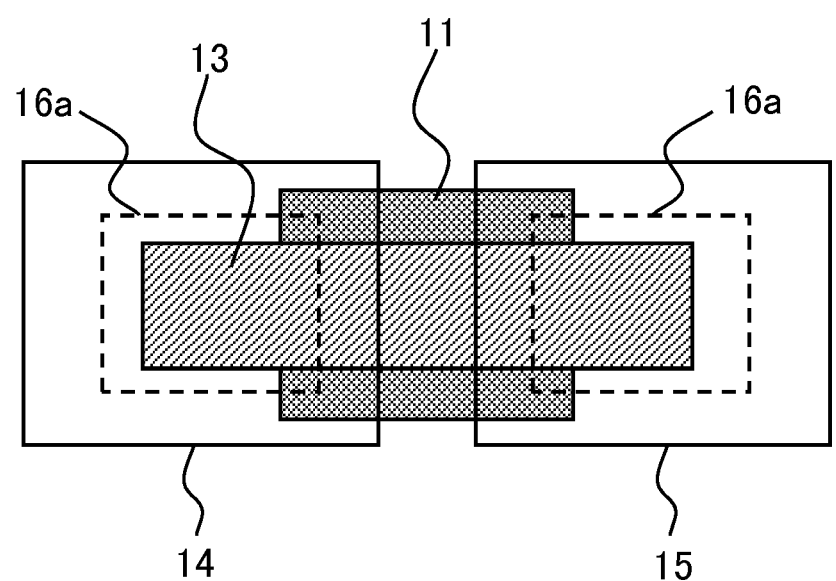
FIG. 3 is a layout diagram schematically illustrating a layout example of an upper surface of a transistor which configures the memory cell illustrated in FIG. 1.

FIG. 2 schematically illustrates a sectional view of an element structure of the transistors Qm, Q1, and Q2. FIG. 3 illustrates a layout example of the upper surfaces of the transistors Qm, Q1, and Q2. Hereinafter, the transistors Qm, Q1, and Q2 will be collectively referred to as a transistor Q. The layout diagram illustrated in FIG. 3 is a representative example of any of the transistors Qm, Q1, and Q2. A channel length and a channel width are examples. A channel length and a channel width of each of the transistors Qm, Q1, and Q2 are individually set such that the writing operation and the reading operation of the memory cell 1 described later are executed properly.

As illustrated in FIG. 2, the transistor Q is configured with a gate electrode 11, a gate insulation film 12 covering the gate electrode 11, a metal oxide semiconductor layer 13, a source electrode 14 and a drain electrode 15, and a channel etching stopper layer 16, which are formed on a glass substrate 10, and a passivation layer 17 formed on these components. The transistor Q has a transistor structure similar to that of the thin-film transistor (TFT) of a bottom gate structure.

In the present embodiment, the metal oxide semiconductor layer 13 formed on the gate insulation film 12 is formed by containing InGaZnOx as a kind of an amorphous oxide semiconductor. InGaZnOx is an n-type metal oxide semiconductor containing indium (In), gallium (Ga), zinc (Zn), and oxygen (O) as main components, and has a characteristic that the n-type metal oxide semiconductor can be formed as a film at a low temperature. A composition ratio of the metal elements of the metal oxide semiconductor layer 13 is substantially In:Ga:Zn=1:1:1. When the composition ratio is adjusted based on this composition ratio, a memory effect described later can be also obtained. Examples of usable materials for the metal oxide semiconductor layer 13 in addition to InGaZnOx include oxide semiconductors such as NiO, $SnO_2$, $TiO_2$, $VO_2$, $In_2O_3$, and $SrTiO_3$, and an oxide semiconductor having various impurities added to these oxide semiconductors.

The gate electrode 11, the source electrode 14, and the drain electrode 15 each are made of a conductive material. The source electrode 14 and the drain electrode 15 are formed to be in contact with the upper surface of the metal oxide semiconductor layer 13 by being separated from each other, and are also formed to cover a part of the channel etching stopper layer 16. The channel etching stopper layer 16 is a stopper film for preventing the metal oxide semiconductor layer 13 of the channel region from being etched at the time of forming the source electrode 14 and the drain electrode 15 by etching. In the present embodiment, the channel etching stopper layer 16 has a function of an oxygen absorbing layer for absorbing oxygen in the metal oxide semiconductor layer 13 diffused by the writing operation to be described later of the memory transistor Qm, and preventing the oxygen from returning again to the inside of the metal oxide semiconductor layer 13.

Therefore, it is preferable that the channel etching stopper layer 16 is a material of a high oxygen absorbing rate in order to fix the oxygen desorbed from the metal oxide semiconductor layer 13 at the writing operation time, although the material may be similar to the material used in the normal metal oxide semiconductor TFT process. For example, a Si-rich CVD silicon oxide film is preferable. Examples of other materials for the channel etching stopper layer 16, which is usable as an oxygen absorbing layer include silicon nitride, silicon oxynitride, $Al_2O_3$, MnO, SiOF, SiOC, organic polymer, and silica insulation films.

An example of a manufacturing method of the transistor Q will be described below.

First, the gate electrode 11 is formed on the glass substrate 10. Specifically, by alternatively carrying out at a temperature of 100° C., the film formation by a sputtering method using titanium as a target material and the film formation by a sputtering method using aluminum as a target, a laminated film made of a titanium layer with a film thickness of 50 nm, an aluminum layer with a film thickness of 200 nm, and a titanium layer with a film thickness of 100 nm is successively formed. Thereafter, the laminated film excluding a formation region of the gate electrode is removed by dry etching using a chlorine gas and an argon gas.

Next, the gate insulation film 12 is formed to cover the gate electrode 11. In the present embodiment, film formation is performed by a CVD method while supplying a silane ($SiH_4$) gas and a nitrous oxide ($N_2O$) gas at a temperature of 300° C., and a silicon oxide film with a film thickness of 300 nm is formed on a whole surface.

Next, the metal oxide semiconductor layer 13 is formed. Specifically, in the present embodiment, oxygen and an argon gas are supplied to a sputtering equipment, and an InGaZnOx layer with a film thickness of about 20 nm to 150 nm is formed by using an InGaZnOx target (a composition ratio In:Ga:Zn:O=1:1:1:4). InGaZnOx of a composition ratio other than the above can be used as a target. Thereafter, wet etching is performed using a mixed etchant of phosphoric acid, nitric acid, and acetic acid, and the InGaZnOx layer excluding the formation region of the metal oxide semiconductor layer 13 is removed. The metal oxide semiconductor layer 13 is configured by three regions including a source region in contact with the source electrode 14, a drain region in contact with the drain electrode 15, and a channel region which is interposed between the source region and the drain region and faces the gate electrode 11 across the gate insulation film 12.

Next, after a silicon oxide film with a film thickness of 100 nm to 400 nm is formed by a CVD method as the channel etching stopper layer 16 a contact opening part is formed by removing the silicon oxide film in a region 16a illustrated in FIG. 3.

Next, the source electrode 14 and the drain electrode 15 are formed. Specifically, similar to formation of the gate electrode 11, by alternatively carrying out, at a temperature of 100° C., the film formation by a sputtering method using titanium as a target material and the film formation by a sputtering method using aluminum as a target, a laminated film made of a titanium layer with a film thickness of 50 nm, an aluminum layer with a film thickness of 200 nm, and a titanium layer with a film thickness of 100 nm is successively formed. Thereafter, the laminated film excluding a formation region of the source electrode 14 and the drain electrode 15 is removed by dry etching using a chlorine gas and an argon gas.

Next, a passivation layer 17 is formed. In the present embodiment, film forming is performed by a CVD method while supplying a silane ($SiH_4$) gas and a nitrous oxide ($N_2O$) gas at a temperature of 200° C., and a silicon oxide film with a film thickness of 150 nm is formed on a whole surface so as to cover the formation region of the transistor Q. Thereafter, baking is performed in the atmosphere at a temperature of 300° C. so that the transistor Q is manufactured.

In the above manufacturing process, in the case of etching the gate insulation film 12 or the passivation layer 17, dry etching using methane tetrafluoride ($CF_4$) and oxygen may be performed. A film-forming condition of each film in the above manufacturing process is just an example, and the film may be formed under other conditions.

In the initial state after the transistor Q is manufactured, the transistor Q indicates a first state in which a transistor operation can be performed corresponding to a voltage application state of the source electrode 14, the drain electrode 15, and the gate electrode 11. However, by flowing a current with a current density equal to or higher than a predetermined value between the source electrode 14 and the drain electrode 15, the transistor Q changes to a second state in which an ohmic conductive characteristic (a resistance characteristic) as a conductor is indicated by Joule heat generated in the channel region and current controllability as a transistor is lost.

In this case, the operation of transiting the state of the memory transistor Qm in the transistor Q from the first state to the second state is defined as a writing operation, and the operation of deciding whether the state of the memory transistor Qm is the first state or the second state is defined as the reading operation.

In the following description, the ON state and the OFF state of the transistor Q in the first state are controlled by the gate-source voltage. The ON state means a conducting state between the drain and the source (a state that a current corresponding to the application voltage flows), and the OFF state means a non-conducting state between the drain and the source (a state that a current corresponding to the application voltage does not flow). Even in the ON state, a current does not flow when a voltage is not applied between the drain and the source. Even in the OFF state, flow of a minute current, for example, several orders of magnitude smaller than the current flowing between the drain and the source in the ON state is permitted.

Figure 4:
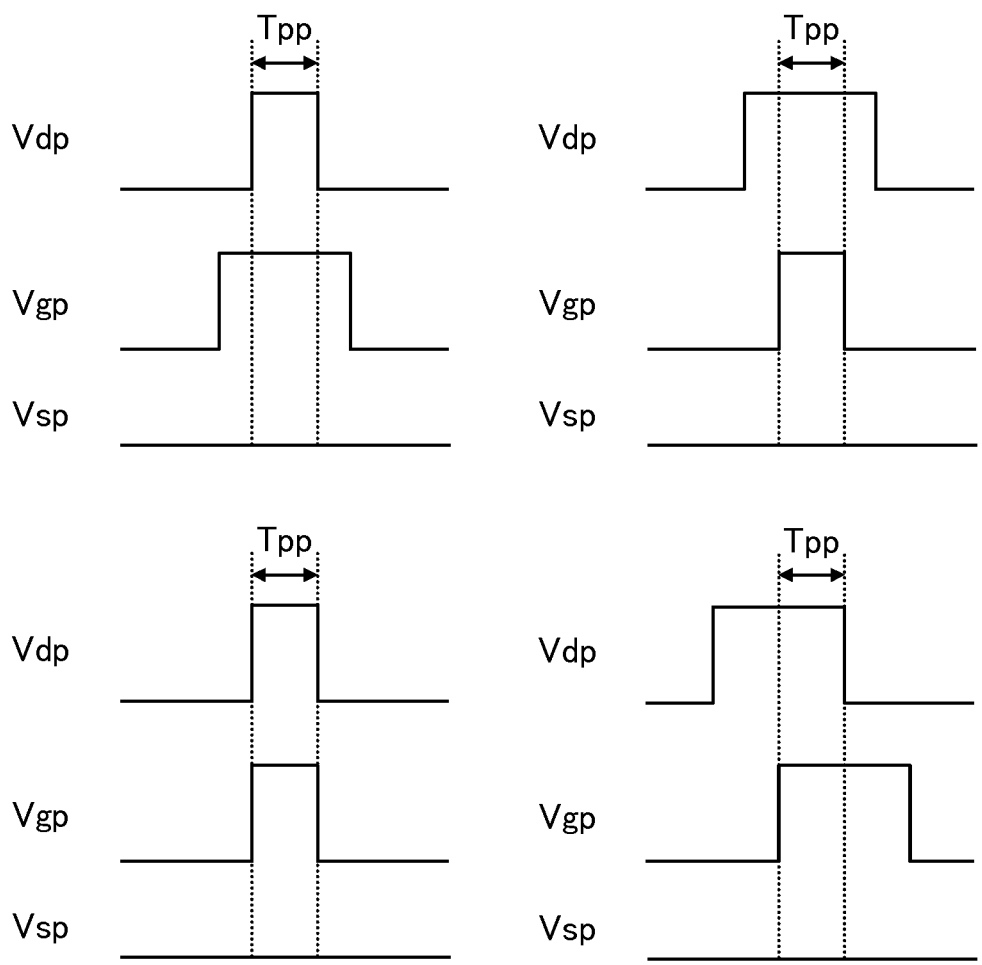
FIG. 4 is a voltage waveform diagram schematically illustrating, by dividing into four patterns, an example of a voltage application method to each terminal at the writing operation time of a memory transistor.

Next, the writing operation to the memory transistor Qm will be described. In the following description, it will be assumed that a predetermined reference voltage Vss is applied to the source (the internal node N3) of the memory transistor Qm, a predetermined writing drain voltage Vdp is applied to the drain (the node N0) of the memory transistor Qm, and a predetermined writing gate voltage Vgp is applied to the gate (the control node NC0) of the memory transistor Qm. A duplicating period of the application period of the writing drain voltage Vdp and the application period of the writing gate voltage Vgp will be set as a writing period Tpp. FIG. 4 schematically illustrates, by dividing into four patterns, an example of voltage waveforms of the voltages Vdp, Vgp, and Vsp applied to the terminals of the memory transistor Qm.

Accordingly, in any of the four patterns, a voltage Vdsp (=Vdp−Vsp) is applied between the drain and the source of the memory transistor Qm, a voltage Vgsp (=Vgp−Vsp) is applied between the gate and the source of the memory transistor Qm, the memory transistor Qm in the first state is brought into the ON state, and thus a writing current Idsp flows between the drain and the source in the writing period Tpp.

When the writing current Idsp flows between the drain and the source of the memory transistor Qm, writing power Pw (=Vdsp×Idsp) expressed by the product with a voltage Vdsp (=Vdp−Vsp) between the drain and the source is consumed in the channel region of the metal oxide semiconductor layer 13. Joule heat corresponding to the writing power Pw generates to heat the channel region. The heating by the Joule heat induces a composition change of the metal oxide semiconductor layer 13 in the channel region, and thus the memory transistor Qm changes from the first state to the second state.

When the reference voltage Vss and the writing gate voltage Vgp have been given, the writing drain voltage Vdp becomes equal to or above (Vgp−Vthm), and the memory transistor Q1 is brought into the driving state in the saturation region. The writing current Idsp is approximately given by the following Expression 1, and becomes maximum in the given gate-source voltage Vgsp.

$$Idsp = (1/2) \times \beta m \times (Vgsp - Vthm)^2$$

$$\beta m = \mu m \times C_{OXm} \times Wm/Lm \qquad \text{(Expression 1)}$$

In Expression 1, $\beta m$, Vthm, $\mu m$, $C_{OXm}$, Wm, and Lm respectively indicate transconductance, a threshold voltage, mobility of the metal oxide semiconductor layer 13, electrostatic capacitance of the gate insulation film 12, a channel width, and a channel length, of the memory transistor Qm.

Further, the given writing voltage Vpp is set so as to hold Vpp=Vgp=Vdp. Thus maximum writing power Pw is obtained, and an efficient writing operation becomes possible.

The writing power Pw is set such that a temperature in the channel region is sufficiently lower than a temperature at which the channel region is fused or the channel region is broken by electromigration of elements configuring the metal oxide semiconductor layer 13, and rises to a sufficiently high temperature range (for example, 200° C. to 900° C.) at which a chemical composition ratio of the metal oxide semiconductor layer 13 changes. The writing current Idsp is set depending on the current density of the current flowing in the channel region such that the current density per channel width W is in the range of 20 $\mu A/\mu m$ to 1000 $\mu A/\mu m$, for example. The writing period Tpp is set to satisfy the above condition in the range of 10$\mu$ seconds to 500 m seconds.

Further, by applying the writing voltage Vdsp in the state that the substrate temperature has been increased in advance, power necessary for the temperature rise can be reduced, and writing can be performed with higher speed by increasing the speed of reaching the temperature necessary for the writing. Further, writing can be performed with a lower writing voltage.

Next, the reading operation to the memory transistor Qm will be described. In the following description, it will be assumed that a predetermined reference voltage Vsr is applied to the source (the internal node N3) of the memory transistor Qm, a predetermined reading drain voltage Vdr is applied to the drain (the node N0) of the memory transistor Qm, and a predetermined reading gate voltage Vgr is applied to the gate (the control node NC0) of the memory transistor Qm. Accordingly, a voltage Vdsr (=Vdr−Vsr) is applied between the drain and the source of the memory transistor Qm, and a voltage Vgsr (=Vgr−Vsr) is applied between the gate and the source of the memory transistor Qm. In this case, the voltage Vgsr (=Vgr−Vsr) is set lower than a threshold voltage Vthm at which the memory transistor Qm is in the first state before the writing operation. As a result, in the case where the memory transistor Qm is in the first state, the memory transistor Qm is brought into the OFF state. Even when the voltage Vdsr (=Vdr−Vsr) is being applied between the drain and the source, a reading current Idsr does not flow or becomes a very minute value when the reading current Idsr flows. On the other hand, in the case where the memory transistor Qm is in the second state, the current/voltage characteristic between the drain and the source of the memory transistor Qm indicates an ohmic resistance characteristic regardless of the reading gate voltage Vgr. Therefore, the reading current Idsr corresponding to the voltage Vdsr (=Vdr−Vsr) and the resistance characteristic flows between the drain and the source. Therefore, by detecting presence/absence or large/small of the reading current Idsr that flows between the drain and the source of the memory transistor Qm, it is possible to easily decide whether the memory transistor Qm is in the first state or the second state.

Figure 5:
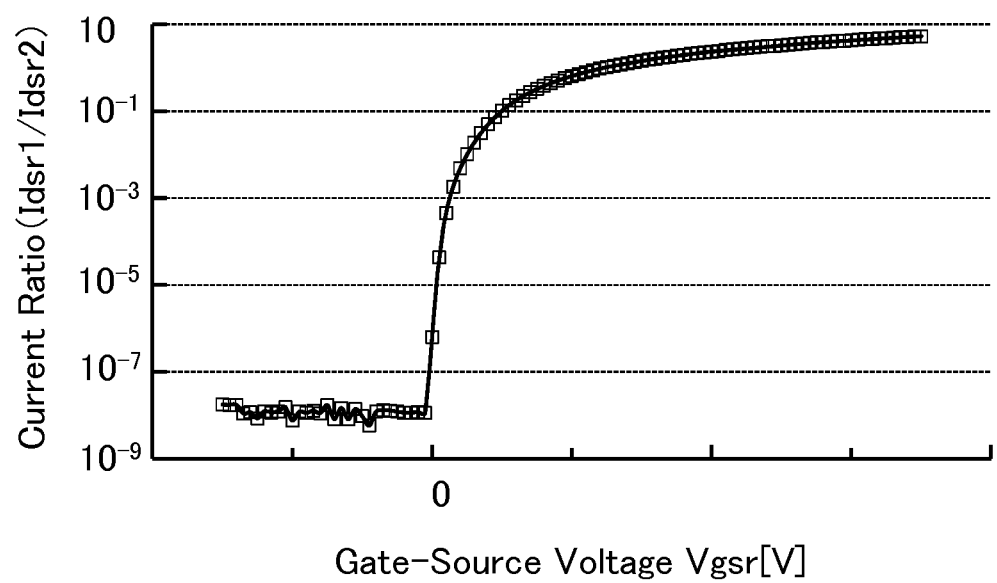
FIG. 5 is a current/voltage characteristic diagram illustrating dependency on a gate-source voltage of a drain/source current ratio before and after the writing operation of the memory transistor.
Figure 6:
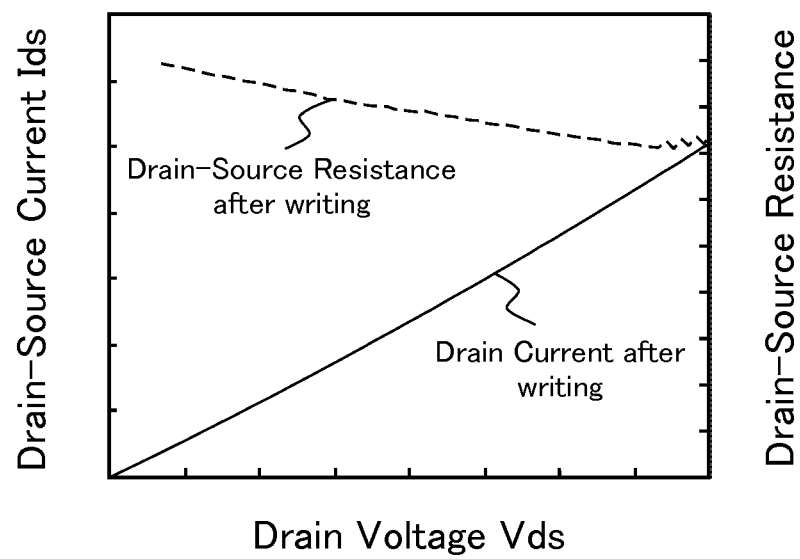
FIG. 6 is a diagram illustrating a current/voltage characteristic and a resistance characteristic between the drain and the source of the memory transistor in a second state.

FIG. 5 illustrates dependency, on the gate-source voltage Vgsr (=Vgr−Vsr), of the reading current Idsr flowing when the voltage Vdsr has been applied between the drain and the source of the memory transistor Qm, as a current ratio (Idsr1/Idsr2) of a reading current Idsr1 flowing in the first state to a reading current Idsr2 flowing in the second state. FIG. 6 illustrates a current/voltage characteristic and a resistance characteristic between the drain and the source of the memory transistor Qm in the second state. A vertical axis of FIG. 5 is expressed by a logarithmic scale, and a lateral axis of FIG. 5 and a vertical axis and a lateral axis of FIG. 6 are expressed by a linear scale.

As is clear from FIG. 5, in the case where the memory transistor Qm is in the first state, the memory transistor Qm indicates a transistor characteristic that a carrier concentration in the channel region is controlled by the gate-source voltage Vgsr. A change in the current ratio (Idsr1/Idsr2) illustrated in FIG. 5 reflects gate voltage dependency of the reading current Idsr1 in the first state. On the other hand, in the case where the memory transistor Qm is in the second state, the carrier concentration in the channel region is maintained in the high state, and is not controlled by the gate-source voltage Vgsr. The reading current Idsr2 is substantially constant regardless of the voltage application state of the gate electrode, and the current/voltage characteristic between the drain and the source indicates substantially a linear ohmic resistance characteristic.

In the example of FIG. 5, in the case where the gate-source voltage Vgsr is a negative voltage, the memory transistor Qm in the first state is brought into the OFF state. At this time, it is clear that a reading current ratio of about $10^8$ is obtained between the first state and the second state. Therefore, it is possible to easily decide whether the memory transistor Qm is in the first state or the second state.

By performing the writing operation and the reading operation to the memory transistor Qm as described above, the memory transistor Qm can allocate logic values "0" and "1" respectively to the first state and the second state, for example, and can be utilized as a memory element that stores binary information in a non-volatile manner.

Next, the writing operation and the reading operation to the memory cell 1 including the memory transistor Qm illustrated in FIG. 1 will be described.

In the present embodiment, in the writing operation, the memory transistor Qm can be utilized as the nonvolatile memory element described above, by adjusting an element design condition (at least one of a channel width, a channel length, and a threshold voltage) and a voltage application condition of the transistors Qm, Q1, and Q2 such that a state transition from the first state to the second state occurs to only the memory transistor Qm and the state transition does not occur to the first and second selection transistors. In both of the writing operation and the reading operation, the first and second selection transistors Q1 and Q2 are fixed to the first state without being transited to the second state.

The first selection transistor Q1 is brought into the ON state at the writing operation time and brought into the OFF state at the reading operation time, as a selection transistor for selecting the memory cell 1 becoming a target of the writing operation. On the other hand, the second selection transistor Q2 is brought into the ON state at the reading operation time and is brought into the OFF state at the writing operation time, as a selection transistor that selects the memory cell 1 becoming a target of the reading operation.

Figure 7:
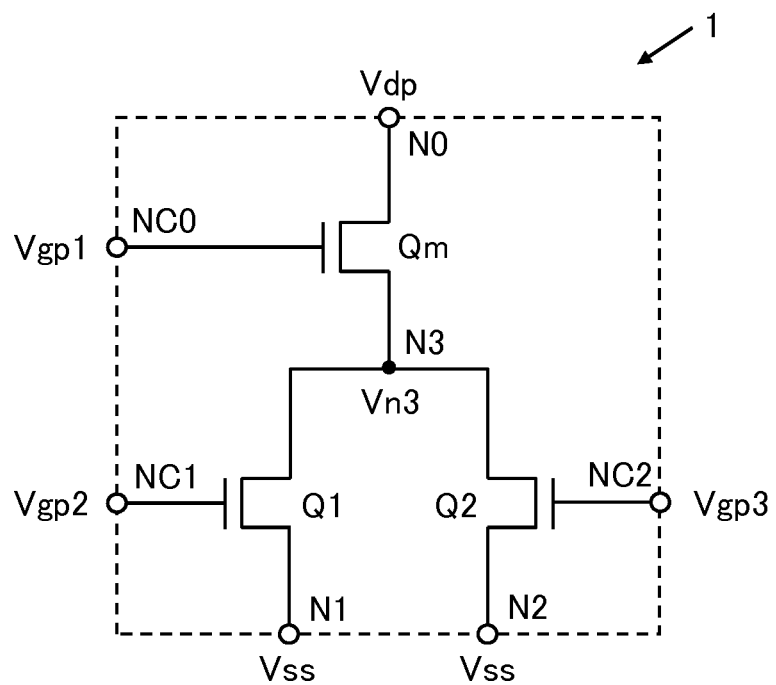
FIG. 7 is a diagram illustrating a first voltage application state to the memory cell illustrated in FIG. 1 at the writing operation time.

FIG. 7 illustrates a first voltage application state to the memory cell 1 at the writing operation time. The first voltage application state indicates a state that the writing drain voltage Vdp is applied to the drain (the node N0) of the memory transistor Qm, the first writing gate voltage Vgp1 is applied to the gate (the control node NC0) of the memory transistor Qm, the reference voltage Vss is applied to the sources (the nodes N1 and N2) of the first and second selection transistors Q1 and Q2, the second writing gate voltage Vgp2 is applied to the gate (the control node NC1) of the first selection transistor, the third writing gate voltage Vgp3 is applied to the gate (the control node NC2) of the second selection transistor, and the source (the internal node N3) of the memory transistor Qm is at the voltage Vn3. In this case, when the reference voltage Vss is set as the ground voltage (0V), it is assumed that Vdp>Vn3>0, Vgp1>Vn3+Vthm, Vgp2>Vth1, and Vgp3<Vth2. Vth1 is a threshold voltage of the first selection transistor Q1, and Vth2 is a threshold voltage of the second selection transistor Q2.

As described above, the memory transistor Qm is driven in the saturation region, and the writing drain voltage Vdp and the first writing gate voltage Vgp1 are set as the same voltages in order to obtain maximum writing power. Then, the writing current Idsp that flows in the memory transistor Qm is given by the following Expression 2 by modifying the above Expression 1.

$$Idsp=(1/2) \times \beta m \times (Vgp1-Vn3-Vthm)^2 \quad \text{(Expression 2)}$$

The first selection transistor Q1 is brought into the driving state in the saturation region expressed by the following Expression 3 or in the linear region expressed by the following Expression 4, in accordance with the relationship between the second writing gate voltage Vgp2 and the voltage Vn3 of the internal node N3. In any driving state, the same current Idsp as that of the writing current Idsp expressed by Expression 2 flows between the drain and the source of the first selection transistor Q1.

$$Idsp=(1/2) \times \beta 1 \times (Vgp2-Vth1)^2 \quad \text{(Expression 3)}$$

wherein, Vn3≥Vgp2−Vth1

$$Idsp=\beta 1 \times \{(Vgp2-Vth1) \times Vn3 - Vn3^2/2\} \quad \text{(Expression 4)}$$

wherein, Vn3<Vgp2−Vth1

In Expression 3 and Expression 4, β1 is a transconductance of the first selection transistor Q1, and is given by ($\mu 1 \times C_{OX1} \times W1/L1$), in which $\mu 1$, $C_{OX1}$, W1, and L1 respectively indicate mobility of the metal oxide semiconductor layer 13, electrostatic capacitance of the gate insulation film 12, a channel width, and a channel length, of the first selection transistor Q1.

Since Idsp in Expression 2 is equal to Idsp in Expression 3 or Expression 4, the voltage Vn3 is obtained by solving Expression 2 and Expression 3 or Expression 2 and Expression 4 in accordance with the relationship between the second writing gate voltage Vgp2 and the voltage Vn3 of the internal node N3. The writing current Idsp is obtained by substituting the voltage Vn3 into Expression 2. Expression 2 to Expression 4 express that the writing current Idsp and the voltage Vn3 are uniquely determined in the first voltage application state, and therefore it is not necessary to actually solve the above numerical expressions.

The product of the writing current Idsp and the drain-source voltage (Vdp−Vn3) of the memory transistor Qm becomes the writing power Pw to the memory transistor Qm. As described above, the writing power Pw is set such that a temperature in the channel region is sufficiently lower than a temperature at which the channel region is fused or the channel region is broken by electromigration of elements configuring the metal oxide semiconductor layer 13, and rises to a sufficiently high temperature range (for example, 200° C. to 900° C.) at which a chemical composition ratio of the metal oxide semiconductor layer 13 changes.

The temperature in the channel region of the memory transistor Qm needs to rise to the temperature range sufficient for the chemical composition ratio of the metal oxide semiconductor layer 13 to change. However, the power consumption (Idsp×Vn3) in the first selection transistor Q1 needs to be suppressed to be sufficiently smaller than the writing power Pw such that the temperature in the channel region of the first selection transistor Q1 does not rise to the above temperature range even when the same writing current Idsp has flown between the drain and the source. Otherwise, the writing operation occurs to the first selection transistor Q1, and the first selection transistor Q1 transits from the first state to the second state. Further, the power input to the memory cell 1 is distributed to the memory transistor Qm and the first selection transistor Q1, and an efficient writing operation to the memory transistor Qm is blocked. Therefore, in order that the drain-source voltage Vdsm (=Vdp−Vn3) of the memory transistor Qm is sufficiently larger than the drain-source voltage Vds1 (=Vn3) of the first selection transistor Q1 (for example, about two times to ten times), the voltage application condition to the nodes N0 and N1 and the control nodes NC0 and NC1 of the memory transistor Qm and the first selection transistor Q1 of the memory cell 1 is adjusted, or the element design condition of the memory transistor Qm and the first selection transistor Q1 is adjusted in addition to the voltage application condition.

Since the third writing gate voltage Vgp3 of a lower voltage than a threshold voltage Vth2 is applied to the gate (the control node NC2) of the second selection transistor Q2 at the time of the writing operation to the memory cell 1, the second selection transistor Q2 is controlled to the OFF state. For example, in the case of Vth2>0, Vgp3=Vss (0V) is held. Consequently, because no current flows between the drain and the source of the second selection transistor Q2 during the writing operation, deterioration of the transistor characteristic attributed to the current does not occur, and the influence that the characteristic deterioration gives to the reading operation can be avoided beforehand. Deterioration of the transistor characteristic can be avoided by not flowing a current between the drain and the source of the second selection transistor Q2. Even when the second selection transistor Q2 is in the ON state, for example, a current does not flow between the drain and the source by setting the source (the node N2) of the second selection transistor Q2 to a floating state without applying the reference voltage Vss (the ground voltage), and a similar effect can be obtained. By controlling the second selection transistor Q2 to the OFF state at the writing operation time, the node N2 can be set to an arbitrary voltage application state. For example, the node N2 can be set to the same potential as that of the node N1, and further the nodes N1 and N2 can be set as one node by short-circuiting. Further, in the case of configuring a memory cell array by using the plurality of memory cells 1, even when a circuit configuration having the node N2 connected in common to a signal line is employed, by controlling the second selection transistor Q2 to the OFF state at the writing operation time, a portion between the internal nodes N3 of the selected memory cell which is a target of the writing operation and the unselected memory cell which is not a target of the writing operation become non-conductive by the second selection transistors Q2 in the respective OFF state. Therefore, the memory transistor Qm of the unselected memory cell can be avoided from being erroneously written.

Figure 8:
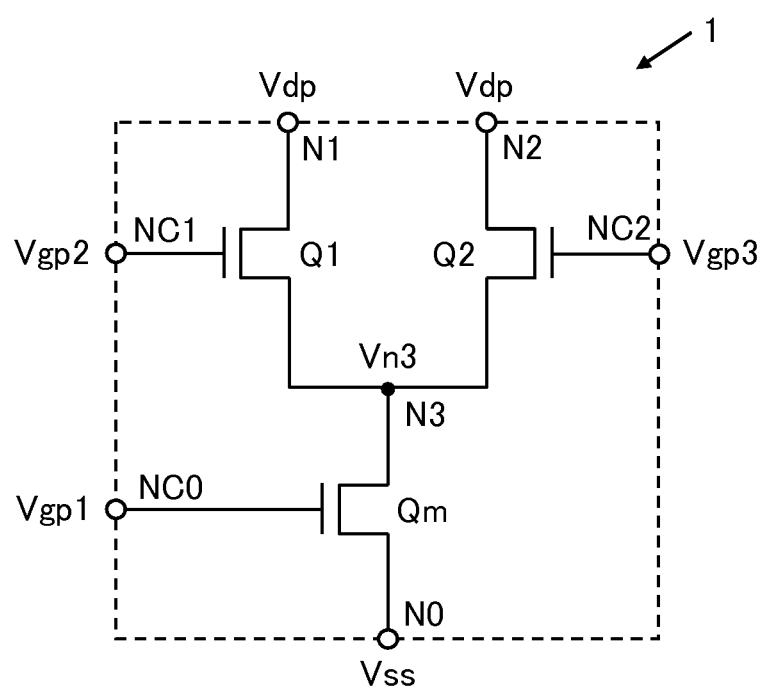
FIG. 8 is a diagram illustrating a second voltage application state to the memory cell illustrated in FIG. 1 at the writing operation time.

FIG. 8 illustrates a second voltage application state to the memory cell 1 in the writing operation time. In the memory cell 1 illustrated in FIG. 8, the drain and the source of each of the transistors Qm, Q1, and Q2 are replaced with each other. The drain of the memory transistor Qm and the sources of the first and second selection transistors Q1 and Q2 are connected to one another to form the internal node N3. The source of the memory transistor Qm configures the node N0, the drain of the first selection transistor Q1 configures the node N1, and the drain of the second selection transistor Q2 configures the node N2.

The second voltage application state indicates a state that the writing drain voltage Vdp is applied to the drains (the nodes N1 and N2) of the first and second selection transistors, the reference voltage Vss is applied to the source (the node N0) of the memory transistor Qm, the first writing gate voltage Vgp1 is applied to the gate (the control node NC0) of the memory transistor Qm, the second writing gate voltage Vgp2 is applied to the gate (the control node NC1) of the first selection transistor, the third writing gate voltage Vgp3 is applied to the gate (the control node NC2) of the second selection transistor, and the drain (the internal node N3) of the memory transistor Qm is at the voltage Vn3. In this case, when the reference voltage Vss is set as the ground voltage (0V), it is assumed that Vdp>Vn3>0, Vgp1>Vthm, Vgp2>Vn3+Vth1, and Vgp3<Vn3+Vth2.

When the first selection transistor Q1 is driven in the saturation region and when the writing drain voltage Vdp and the second writing gate voltage Vgp2 are set as the same voltages, the writing current Idsp that flows in the first selection transistor Q1 is given by the following Expression 5.

$$Idsp=(\tfrac{1}{2})\times \beta 1\times (Vgp2-Vn3-Vth1)^2 \quad \text{(Expression 5)}$$

The memory transistor Qm is brought into the driving state in the saturation region expressed by the following Expression 6 or in the linear region expressed by the following Expression 7, in accordance with the relationship between the first writing gate voltage Vgp1 and the voltage Vn3 of the internal node N3. In any driving state, the same current Idsp as that of the writing current Idsp expressed by Expression 5 flows between the drain and the source of the memory transistor Qm.

$$Idsp=(\tfrac{1}{2})\times \beta m\times (Vgp1-Vthm)^2 \quad \text{(Expression 6)}$$

wherein, Vn3≥Vgp1−Vthm $$Idsp=\beta m\times \{(Vgp1-Vthm)\times Vn3-Vn3^2/2\} \quad \text{(Expression 7)}$$

wherein Vn3<Vgp1−Vthm

Since Idsp in Expression 5 is equal to Idsp in Expression 6 or Expression 7, the voltage Vn3 is obtained by solving Expression 5 and Expression 6 or Expression 5 and Expression 7 in accordance with the relationship between the first writing gate voltage Vgp1 and the voltage Vn3 of the internal node N3. The writing current Idsp is obtained by substituting the voltage Vn3 into Expression 5. Expression 5 to Expression 7 express that the writing current Idsp and the voltage Vn3 are uniquely determined in the second voltage application state, and therefore, it is not necessary to actually solve the above numerical expressions.

The product of the writing current Idsp and the drain-source voltage (Vn3) of the memory transistor Qm becomes the writing power Pw to the memory transistor Qm. As described above, the writing power Pw is set such that a temperature in the channel region is sufficiently lower than a temperature at which the channel region is fused or the channel region is broken by electromigration of elements configuring the metal oxide semiconductor layer 13, and rises to a sufficiently high temperature range (for example, 200° C. to 900° C.) in which a chemical composition ratio of the metal oxide semiconductor layer 13 changes.

The temperature in the channel region of the memory transistor Qm needs to rise to the temperature range sufficient for the chemical composition ratio of the metal oxide semiconductor layer 13 to change. However, the power consumption (Idsp×(Vdp−Vn3)) in the first selection transistor Q1 needs to be suppressed to be sufficiently smaller than the writing power Pw such that the temperature in the channel region of the first selection transistor Q1 does not rise to the above temperature range even when the same writing current Idsp has flown between the drain and the source. Otherwise, the writing operation occurs to the first selection transistor Q1, and the first selection transistor Q1 transits from the first state to the second state. Further, the power input to the memory cell 1 is distributed to the memory transistor Qm and the first selection transistor Q1, and an efficient writing operation to the memory transistor Qm is blocked. Therefore, in order that the drain-source voltage Vdsm (=Vn3) of the memory transistor Qm is sufficiently larger than the drain-source voltage Vds1 (=Vdp−Vn3) of the first selection transistor Q1 (for example, about two times to ten times), the voltage application condition to the nodes N0 and N1 and the control nodes NC0 and NC1 of the memory transistor Qm and the first selection transistor Q1 of the memory cell 1 is adjusted, or the element design condition of the memory transistor Qm and the first selection transistor Q1 is adjusted in addition to the voltage application condition.

Since the third writing gate voltage Vgp3 of a lower voltage than a voltage (Vn3+Vth2) obtained by adding the threshold voltage Vth2 to the voltage Vn3 of the internal node N3 is applied to the gate (the control node NC2) of the second selection transistor Q2 at the time of the writing operation to the memory cell 1, the second selection transistor Q2 is controlled to the OFF state. Effects, advantages, and the like of controlling the second selection transistor Q2 to the OFF state at the writing operation time are the same as those in the case of the above first voltage application state, and thus redundant description will be omitted.

In comparing between the first voltage application state and the second voltage application state at the writing operation time, it is preferable to lower the voltage Vn3 of the internal node N3 as much as possible in the first voltage application state, and it is preferable to increase the voltage Vn3 as much as possible in the second voltage application state. However, in the second voltage application state, the voltage Vn3 becomes a lower voltage than the voltage (Vgp2−Vth1) obtained by subtracting the threshold voltage Vth1 of the first selection transistor Q1 from the gate voltage Vgp2 (the second writing gate voltage) of the first selection transistor Q1. Therefore, for the constraint of a large-small relationship between the voltage Vn3 and the voltage (Vdp−Vn3), the first voltage application state is more easily realized than the second voltage application state and is preferable.

Figure 9:
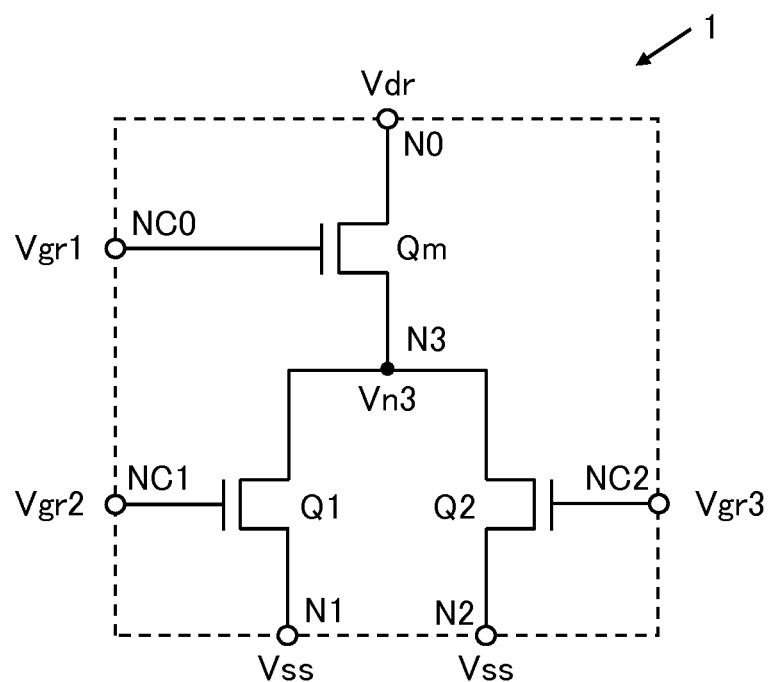
FIG. 9 is a diagram illustrating a third voltage application state to the memory cell illustrated in FIG. 1 at the reading operation time.

FIG. 9 illustrates a third voltage application state to the memory cell 1 at the reading operation time. The third voltage application state indicates a state that the reading drain voltage Vdr is applied to the drain (the node N0) of the memory transistor Qm, the first reading gate voltage Vgr1 is applied to the gate (the control node NC0) of the memory transistor Qm, the reference voltage Vss is applied to the sources (the nodes N1 and N2) of the first and second selection transistors Q1 and Q2, the second reading gate voltage Vgr2 is applied to the gate (the control node NC1) of the first selection transistor, the third reading gate voltage Vgr3 is applied to the gate (the control node NC2) of the second selection transistor, and the source (the internal node N3) of the memory transistor Qm is at the voltage Vn3. In this case, when the reference voltage Vss is set as the ground voltage (0V), it is assumed that Vdr>Vn3≥0, Vgr1<Vn3+Vthm, Vgr2<Vth1, and Vgr3>Vth2.

In the third voltage application state, similarly to the reading operation to the memory transistor Qm, the memory transistor Qm is brought into the OFF state when the memory transistor Qm is in the first state, and the current/voltage characteristic between the drain and the source of the memory transistor Qm indicates an ohmic resistance characteristic regardless of the first reading gate voltage Vgr1 when the memory transistor Qm is in the second state. As described above, the first selection transistor Q1 is in the OFF state, and the second selection transistor Q2 is in the ON state. ON and OFF of the first and second selection transistors are reversed from those at the writing operation time.

From the above results, in the case where the memory transistor Qm is in the OFF state in the first state, the voltage Vn3 of the internal node N3 of the memory cell 1 becomes the reference voltage Vss by the second selection transistor Q2 in the ON state, and the reading current Idsr does not flow between the node N0 and the node N2. On the other hand, in the case where the memory transistor Qm indicates the resistance characteristic in the second state, when the resistance value in the second state is Rm, the reading current Idsr expressed by the following Expression 8 flows in the memory transistor Qm. The second selection transistor Q2 is brought into the driving state in the saturation region expressed by the following Expression 9 or in the linear region expressed by the following Expression 10, in accordance with the relationship between the third reading gate voltage Vgr3 and the voltage Vn3 of the internal node N3. In any driving state, the same current Idsr as the reading current Idsr expressed by Expression 8 flows between the drain and the source of the second selection transistor Q2.

$$Idsr=(Vdr-Vn3)/Rm \quad \text{(Expression 8)}$$

$$Idsr=(½)\times\beta2\times(Vgr3-Vth2)^2 \quad \text{(Expression 9)}$$

wherein, Vn3≥Vgr3−Vth2

$$Idsr=\beta2\times\{(Vgr3-Vth2)\times Vn3-Vn3^2/2\} \quad \text{(Expression 10)}$$

wherein, Vn3<Vgr3−Vth2

In Expression 9 and Expression 10, β2 is a transconductance of the second selection transistor Q2, and is given by (μ2×$C_{OX2}$×W2/L2), in which μ2, $C_{OX2}$, W2, and L2 respectively indicate mobility of the metal oxide semiconductor layer 13, electrostatic capacitance of the gate insulation film 12, a channel width, and a channel length, of the second selection transistor Q2.

Since Idsr in Expression 8 is equal to Idsr in Expression 9 or Expression 10, the voltage Vn3 is obtained by solving Expression 8 and Expression 9 or Expression 8 and Expression 10 in accordance with the relationship between the third reading gate voltage Vgr3 and the voltage Vn3 of the internal node N3. The reading current Idsr is obtained by substituting the voltage Vn3 into Expression 8. Expression 8 to Expression 10 express that the reading current Idsr and the voltage Vn3 are uniquely determined in the third voltage application state, and therefore, it is not necessary to actually solve the above numerical expressions.

Thus, in the case where the memory transistor Qm is in the OFF state in the first state, the reading current Idsr does not flow, and the voltage Vn3 of the internal node N3 becomes the reference voltage Vss. In the case where the memory transistor Qm indicates a resistance characteristic in the second state, the reading current Idsr expressed by Expression 8 flows, and the voltage Vn3 of the internal node N3 becomes a voltage obtained by subtracting a voltage drop (Idsr×Rm) in the memory transistor Qm from the reading drain voltage Vdr. Therefore, for example, by detecting the current value of the reading current Idsr at the node N0 or by detecting the voltage of the internal node N3, it is possible to decide whether the memory transistor Qm is in the first state or the second state.

Further, in the case where the application of the reading drain voltage Vdr to the node N0 is performed from the voltage source of the voltage Vdr via a load circuit configured by a transistor and/or a resistance element, a voltage drop corresponding to the reading current Idsr occurs in the node N0. Therefore, the voltage value of the node N0 changes corresponding to the current value of the reading current Idsr. Therefore, in the case where the load circuit is being connected to the node N0, whether the memory transistor Qm is in the first state or the second state can be also decided by detecting the voltage value of the node N0.

Figure 10:
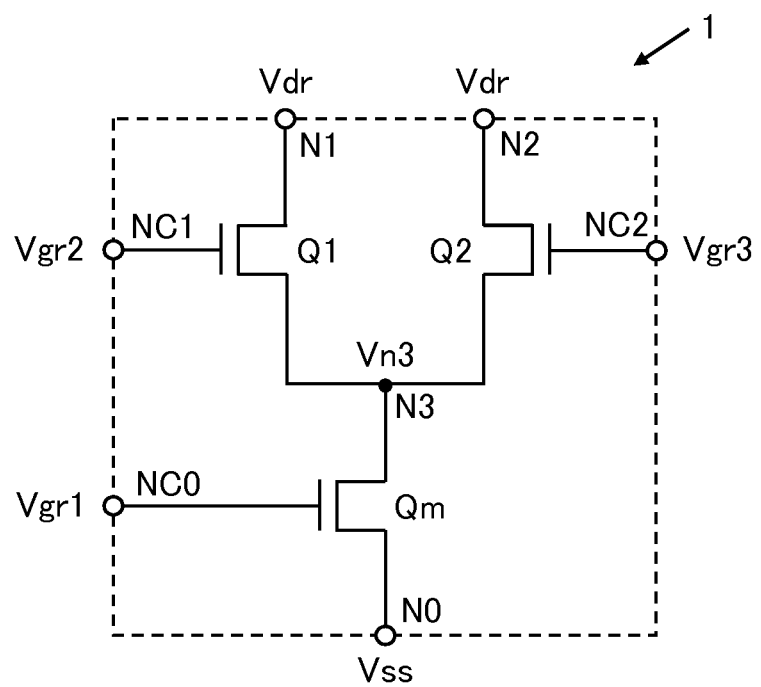
FIG. 10 is a diagram illustrating a fourth voltage application state to the memory cell illustrated in FIG. 1 at the reading operation time.

FIG. 10 illustrates a fourth voltage application state to the memory cell 1 at the reading operation time. In the memory cell 1 illustrated in FIG. 10, similarly to the second voltage application state at the writing operation time, the drain and the source of each of the transistors Qm, Q1, and Q2 are replaced with each other. The drain of the memory transistor Qm and the sources of the first and second selection transistors Q1 and Q2 are connected to one another to form the internal node N3. The source of the memory transistor Qm configures the node N0, the drain of the first selection transistor Q1 configures the node N1, and the drain of the second selection transistor Q2 configures the node N2.

The fourth voltage application state indicates a state that the reading drain voltage Vdr is applied to the drains (the nodes N1 and N2) of the first and second selection transistors, the reference voltage Vss is applied to the source (the node N0) of the memory transistor Qm, the first reading gate voltage Vgr1 is applied to the gate (the control node NC0) of the memory transistor Qm, the second reading gate voltage Vgr2 is applied to the gate (the control node NC1) of the first selection transistor, the third reading gate voltage Vgr3 is applied to the gate (the control node NC2) of the second selection transistor, and the drain (the internal node N3) of the memory transistor Qm is at the voltage Vn3. In this case, when the reference voltage Vss is set as the ground voltage (0V), it is assumed that Vdr>Vn3>0, Vgr1<Vthm, Vgr2<Vn3+Vth1, and Vgr3>Vn3+Vth2.

In the fourth voltage application state, similarly to the third voltage application state and the reading operation to the memory transistor Qm, the memory transistor Qm is brought into the OFF state when the memory transistor Qm is in the first state, and the current/voltage characteristic between the drain and the source of the memory transistor Qm indicates an ohmic resistance characteristic regardless of the first reading gate voltage Vgr1 when the memory transistor Qm is in the second state. As described above, the first selection transistor Q1 is in the OFF state, and the second selection transistor Q2 is in the ON state.

From the above results, in the case where the memory transistor Qm is in the OFF state in the first state, the voltage Vn3 of the internal node N3 of the memory cell 1 becomes the reading drain voltage Vdr by the second selection transistor Q2 in the ON state, and the reading current Idsr does not flow between the node N0 and the node N2. On the other hand, in the case where the memory transistor Qm indicates the resistance characteristic in the second state, when the resistance value in the second state is Rm, the reading current Idsr expressed by the following Expression 11 flows in the memory transistor Qm. When the second selection transistor Q2 is driven in the saturation region and when the reading drain voltage Vdr and the third reading gate voltage Vgr3 are set as the same voltages, the reading current Idsr that flows in the second selection transistor Q2 is given by the following Expression 12.

$$Idsr = Vn3/Rm \quad \text{(Expression 11)}$$

$$Idsr = (1/2) \times \beta 2 \times (Vgr3 - Vn3 - Vth2)^2 \quad \text{(Expression 12)}$$

Since Idsr in Expression 11 is equal to Idsr in Expression 12, the voltage Vn3 is obtained by solving Expression 11 and Expression 12. The reading current Idsr is obtained by substituting the voltage Vn3 into Expression 11. Expression 11 and Expression 12 express that the reading current Idsr and the voltage Vn3 are uniquely determined in the fourth voltage application state, and therefore, it is not necessary to actually solve the above numerical expressions.

Thus, in the case where the memory transistor Qm is in the OFF state in the first state, the reading current Idsr does not flow, and the voltage Vn3 of the internal node N3 becomes the reading drain voltage Vdr. In the case where the memory transistor Qm indicates a resistance characteristic in the second state, the reading current Idsr expressed by Expression 11 flows, and the voltage Vn3 of the internal node N3 becomes the same voltage as the voltage drop (Idsr×Rm) in the memory transistor Qm. Therefore, for example, by detecting the current value of the reading current Idsr at the node N0 or by detecting the voltage of the internal node N3, it is possible to decide whether the memory transistor Qm is in the first state or the second state.

Further, in the case where the application of the reading drain voltage Vdr to the node N0 is performed from the voltage source of the voltage Vdr via a load circuit configured by a transistor and/or a resistance element, a voltage drop corresponding to the reading current Idsr occurs in the node N0. Therefore, the voltage value of the node N0 changes corresponding to the current value of the reading current Idsr. Therefore, in the case where the load circuit is being connected to the node N0, whether the memory transistor Qm is in the first state or the second state can be also decided by detecting the voltage value of the node N0.

Next, description will be made on advantages of using distinctively the first and second selection transistors Q1 and Q2 between the writing operation and the reading operation. In the present embodiment, the thin-film transistor of the metal oxide semiconductor is used as the memory transistor Qm and the first and second selection transistors Q1 and Q2. When a large current is flown between the drain and the source, the thin-film transistor generally causes a deterioration of the transistor characteristic such as a large increase in the threshold voltage and reduction in the ON current by the large increase in the threshold voltage due to a self heating deterioration phenomenon inherent to the thin-film transistor. The self heating deterioration phenomenon is the following phenomenon. Since the substrate of the thin-film transistor is composed of a glass substrate or the like, and has poor thermal conductivity as compared with a single-crystal Si substrate and the like, self heating by the current between the drain and the source is not effectively discharged. Therefore, due to a temperature rise in the channel region, separation of hydrogen from the gate insulation film or injection of electron is promoted, and a threshold voltage varies.

Therefore, in the case of transiting the memory transistor Qm from the first state to the second state by flowing a writing current between the drain and the source of the memory cell transistor Qm, the same writing current also flows in the first selection transistor Q1. Accordingly, there is a possibility of rise in the threshold voltage due to the self heating deterioration phenomenon in the first selection transistor Q1 as a thin-film transistor by the writing current.

Figure 11:
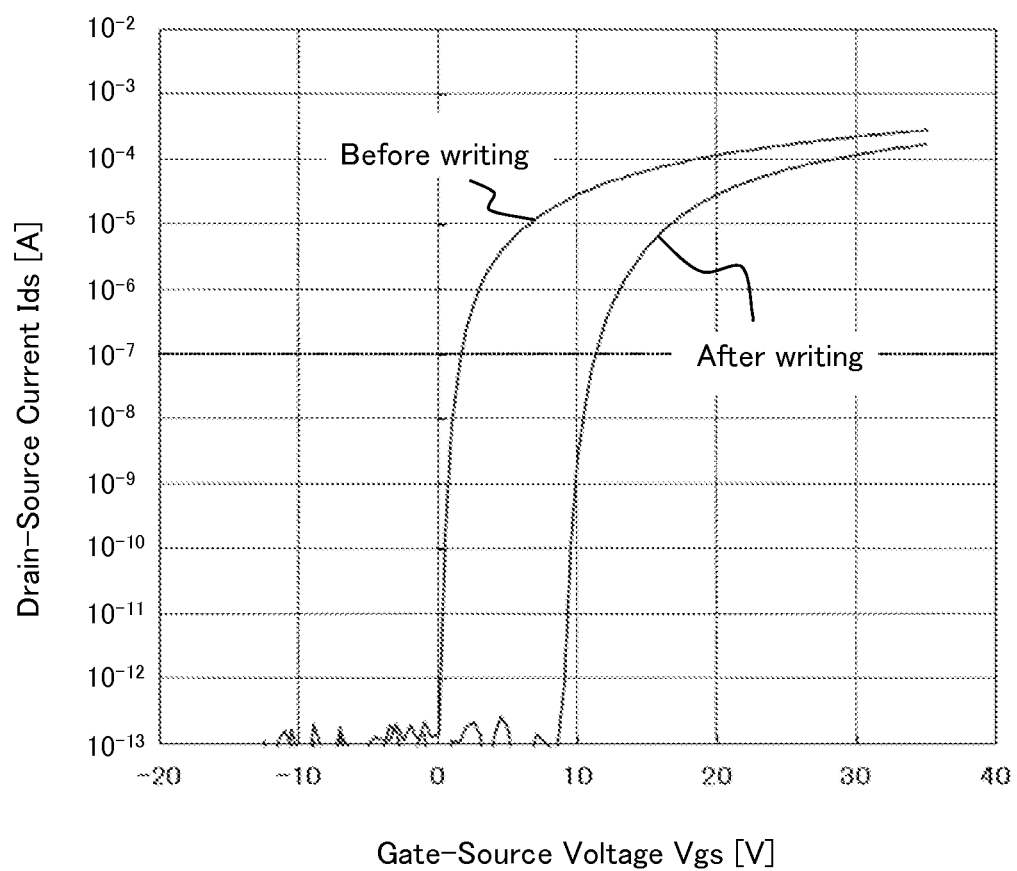
FIG. 11 illustrates changes in a current/voltage characteristic between a drain-source current and a gate-source voltage of the first selection transistor before and after the writing operation to the memory transistor.

FIG. 11 illustrates, in two ways of before and after the writing operation of the memory transistor Qm, current/voltage characteristics of the gate-source voltage Vgs and a drain-source current Ids of the first selection transistor Q1 used in the writing operation. It can be understood that, by the writing operation, the threshold voltage of the first selection transistor Q1 increases by about 8 V to 9 V, and an ON current Ids at the gate-source voltage Vgs decreases. The drain-source current Ids in the OFF state has no difference before and after the writing operation, and deterioration of a characteristic is not observed. That is, characteristic deterioration of the first selection transistor Q1 is characteristic deterioration in the ON state.

Therefore, the same first selection transistor Q1 is used in both the writing operation and the reading operation without providing the second selection transistor Q2 in the memory cell 1. If the threshold voltage Vth1 of the first selection transistor Q1 has increased by ΔVth by the writing operation, Expression 9 and Expression 10 in the third voltage application state become as expressed by Expression 13 Expression 14. In Expression 13 and Expression 14, Vth1 indicates the threshold voltage before the writing operation of the first selection transistor Q1.

$$Idsr = (1/2) \times \beta 1 \times (Vgr2 - Vth1 - \Delta Vth)^2 \quad \text{(Expression 13)}$$

wherein, Vn3 ≥ Vgr2 − Vth1 − ΔVth $$Idsr = \beta 1 \times \{(Vgr2 - Vth1 - \Delta Vth) \times Vn3 - Vn3^2/2\} \quad \text{(Expression 14)}$$

wherein Vn3 < Vgr2 − Vth1 − ΔVth

In this case, Vgr3>Vth2 used in the third voltage application state needs to be changed to Vgr2>Vth1+ΔVth in the case of using the first selection transistor Q1 also in the reading operation. In this case, because the threshold voltage Vth1 of the first selection transistor Q1 before the writing operation and the threshold voltage Vth2 of the second selection transistor Q2 are the same, the second reading gate voltage Vgr2 in the case of using the first selection transistor Q1 in the reading operation needs to be set higher by ΔVth than the third reading gate voltage Vgr3 in the third voltage application state. This fact is also similarly applied to the reading operation in the fourth voltage application state. Therefore, when the second reading gate voltage Vgr2 has been set in a similar manner to that in the reading operation in the third or fourth voltage application state, the first selection transistor Q1 is brought into the OFF state, and the reading current Idsr does not flow in the memory cell 1 in which the memory transistor Qm is in the second state. Accordingly, it becomes impossible to distinguish from the memory cell 1 in which the memory transistor Qm to which the reading current Idsr does not flow is in the first state, and the normal reading operation cannot be performed. Further, in the memory cell 1 in which the memory transistor Qm is in the second state, in order that the first selection transistor Q1 is not brought into the OFF state, it is necessary that the second reading gate voltage Vgr2 is set higher by ΔVth than the third reading gate voltage Vgr3 at the reading operation time in the third or fourth voltage application state, and this becomes a barrier to a high-speed and low-power consumption reading operation. Further, the rise in the threshold voltage has a possibility of generating a variance in each memory cell. Even when the first selection transistor Q1 is in the ON state, there is a possibility of the occurrence of a variance in the ON current and reduction in the reading operation margin.

Further, in the case of using the same first selection transistor Q1 in both the writing operation and the reading operation, in order to avoid the occurrence of characteristic deterioration, it becomes necessary to suppress the writing current, and there is a possibility of reduction in the writing characteristic of the memory transistor Qm.

Thus, in the present embodiment, by distinctively using the first and second selection transistors Q1 and Q2 between the writing operation and the reading operation and by controlling the first selection transistor Q1 to the OFF state at the reading operation time, it becomes possible to solve the above problems at the reading operation time, and the reading operation can be performed at a high speed with low power consumption, without receiving the influence of characteristic deterioration of the first selection transistor Q1. Further, because the first selection transistor Q1 can pass the writing current by permitting characteristic deterioration at the writing operation time, the problem of reduction in the writing characteristic of the memory transistor Qm can be also solved.

Second Embodiment

Next, description will be made on the present memory device 20 including a memory cell array 21 configured by having a plurality of memory cells 1 illustrated in FIG. 1 arranged in a matrix shape in the row direction and the column direction.

Figure 12:
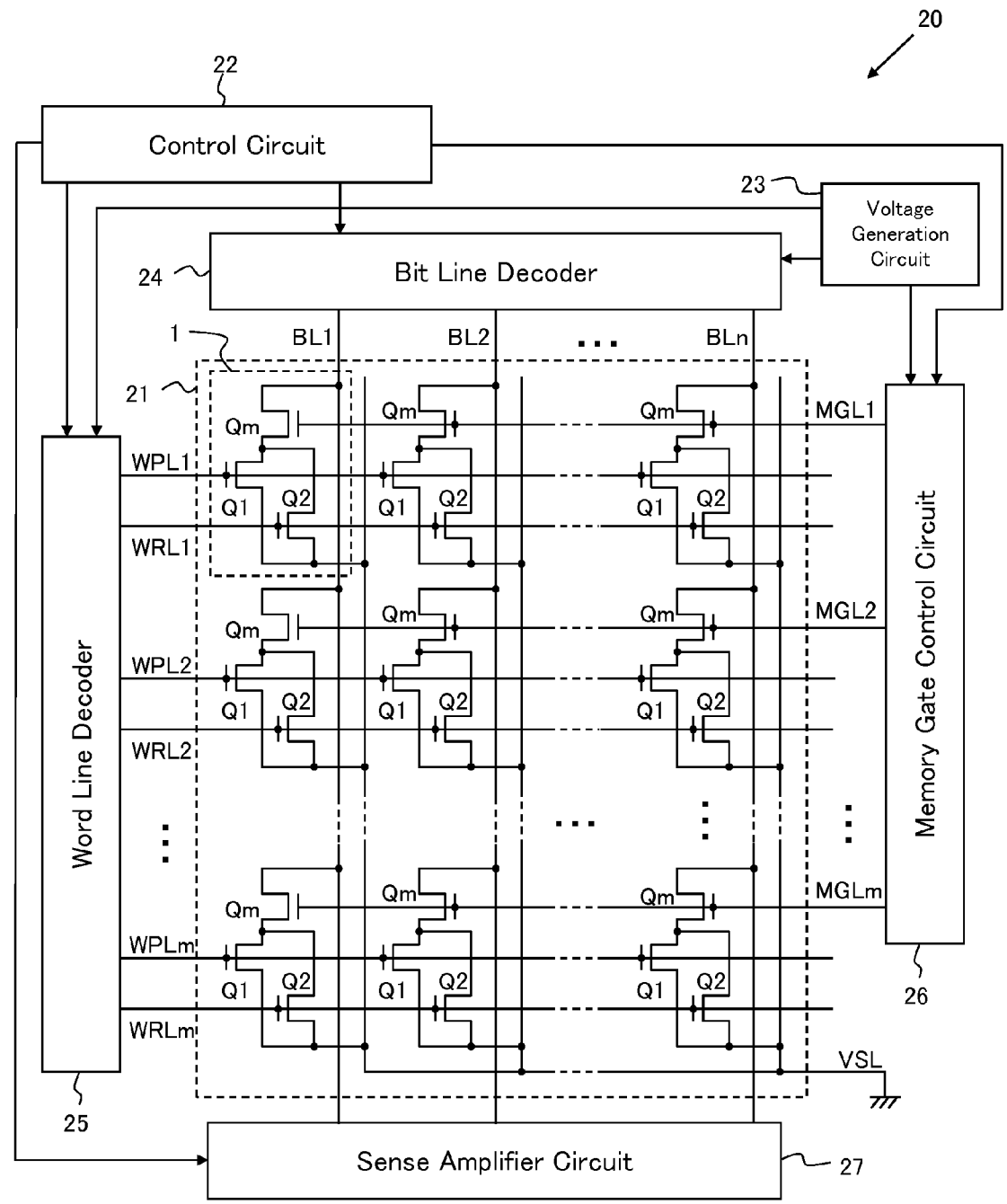
FIG. 12 is a circuit block diagram schematically illustrating a configuration example of a memory cell array and a peripheral circuit in a non-volatile memory device according to a second embodiment of the present invention.

FIG. 12 illustrates a schematic circuit block configuration of the present memory device 20. As illustrated in FIG. 12, the present memory device 20 includes the memory cell array 21, a control circuit 22, a voltage generation circuit 23, a bit line decoder 24, a word line decoder 25, a memory gate control circuit 26, and a sense amplifier circuit 27.

The memory cell array 21 is configured by having m memory cells 1 arranged in the column direction and having n memory cells 1 arranged in the row direction, and further includes m memory gate lines MGL1 to MGLm (corresponding to the first control lines) extending in the row direction, m first word lines WPL1 to WPLm (corresponding to the second control lines) extending in the row direction, m second word lines WRL1 to WRLm (corresponding to the third control lines) extending in the row direction, n bit lines BL1 to BLn (corresponding to the data signal lines) extending in the column direction, and a reference voltage line VSL. Here m and n each are an integer equal to or larger than two.

Each of the memory gate lines MGL1 to MGLm is connected in common to each gate (the control node NC0) of the memory transistors Qm of the n memory cells 1 arranged in corresponding row. Each of the first word lines WPL1 to WPLm is connected in common to each gate (the control node NC1) of the first selection transistors Q1 of the n memory cells 1 arranged in corresponding row. Each of the second word lines WRL1 to WRLm is connected in common to each gate (the control node NC2) of the second selection transistors Q2 of the n memory cells 1 arranged in corresponding row. Each of the bit lines BL1 to BLn is connected in common to each drain (the node N0) of the memory transistors Qm of the m memory cells 1 arranged in corresponding column. The reference voltage line VSL is connected in common to each source (the nodes N1 and N2) of the first and second selection transistors Q1 and Q2 of all the memory cells 1. In the present embodiment, the reference voltage Vss (the ground voltage (0V), for example) is always supplied to the reference voltage line VSL in the writing operation and the reading operation.

The configuration of the memory cell array 21 illustrated in FIG. 12 assumes the first voltage application state at the writing operation time and the third voltage application state at the reading operation time described in the first embodiment. That is, in the first and third voltage application states, it is assumed that the writing drain voltage Vdp or the reading drain voltage Vdr is applied to the bit line BL (a general name of bit lines BL1 to BLn) connected to the drain (the node N0) of the memory transistor Qm of the selected memory cell 1 as a target of each operation.

Figure 13:
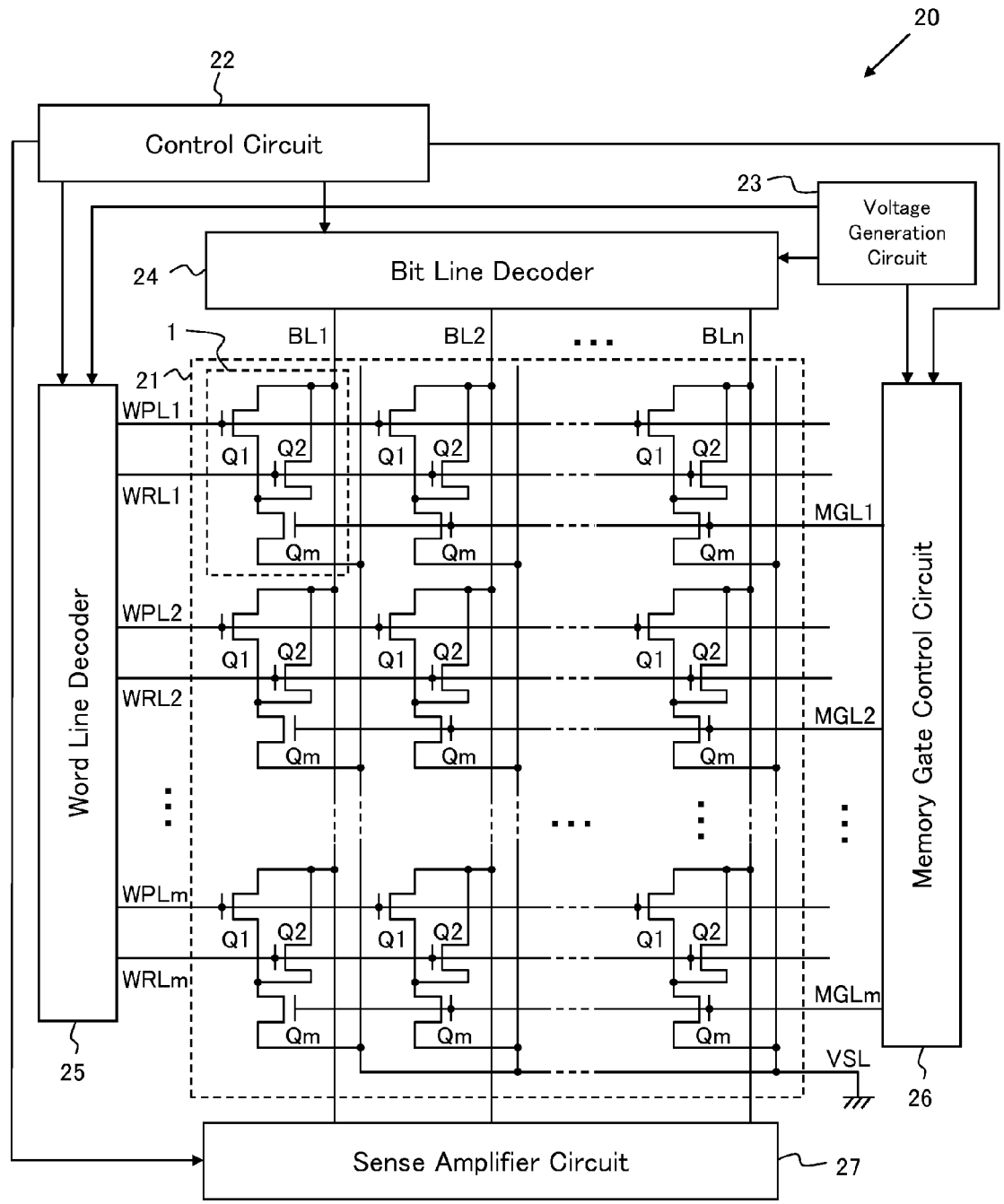
FIG. 13 is a circuit block diagram schematically illustrating another configuration example of a memory cell array and a peripheral circuit in a non-volatile memory device according to the second embodiment of the present invention.

In the case where the second voltage application state at the writing operation time and the fourth voltage application state at the reading operation time described in the first embodiment are assumed, as described above, in each memory cell 1, the source of the memory transistor Qm configures the node N0, the drain of the first selection transistor Q1 configures the node N1, and the drain of the second selection transistor Q2 configures the node N2. As illustrated in FIG. 13, each of the bit lines BL0 to BLn is connected in common to each source (the nodes N1 and N2) of the first and second selection transistors Q1 and Q2 of the m memory cells 1 arranged in corresponding rows. The reference voltage line VSL is connected in common to the sources (the nodes N0) of the memory transistors Qm of all the memory cells 1. Connections of the memory gate line MGL (a general name of the memory gate lines MGL1 to MGLm), the first word line WPL (a general name of the first word lines WPL1 to WPLm), and the second word line WRL (a general name of the second word lines WRL1 to WRLm) are the same as those in the case of the above first and third voltage application states.

The control circuit 22 controls the writing operation and the reading operation of the memory cells 1 in the memory cell array 21. Specifically, the control circuit 22 controls the voltage generation circuit 23, the bit line decoder 24, the word line decoder 25, the memory gate control circuit 26, and the sense amplifier circuit 27, based on an address signal input from an address line (not illustrated), a data input which is input from a data line, and a control input signal input from a control signal line.

In the writing operation and the reading operation, the voltage generation circuit 23 generates a selected gate voltage necessary to select the memory cell 1 as a target of the operation and an unselected gate voltage to be applied to the unselected memory cell 1 as not a target of the operation, and supplies the word line decoder 25 and the memory gate control circuit 26 with these voltages. Further, the voltage generation circuit 23 generates the bit line voltage necessary to write and read the memory cell 1 selected as a target of the operation, and supplies the bit line decoder 24 with the bit line voltage.

The selected gate voltage corresponds to the first to third writing gate voltages Vgp1, Vgp2, and Vgp3 at the writing operation time, and the first to third reading gate voltages Vgr1, Vgr2, and Vgr3 at the reading operation time described in the first embodiment. Further, the bit line voltage corresponds to the writing drain voltage Vdp at the writing operation time and the reading drain voltage Vdr at the reading operation time described in the first embodiment.

For the unselected gate voltage at the writing operation time to be applied to each of the control nodes NC0 to NC2, the selected gate voltages Vgr1, Vgr2, and Vgr3 at the reading operation time to be applied to each of the control nodes NC0 to NC2 can be used as they are. For the unselected gate voltage at the reading operation time to be applied to the control node NC0, the selected gate voltage Vgr1 at the reading operation time to be applied to the control node NC0 can be used as it is. That is, at the reading operation time, the same first reading gate voltage Vgr1 is applied to all the control nodes NC0. For the unselected gate voltage at the reading operation time to be applied to the control nodes NC1 and NC2, the selected gate voltages Vgp2 and Vgp3 at the writing operation time to be applied to the control nodes NC1 and NC2 can be used as they are. At the writing operation time, the same first writing gate voltage Vgp1 may be also applied to all the control nodes NC0.

When an address of the memory cell 1 as a target of the operation has been assigned at the writing operation time and the reading operation time, the bit line decoder 24 selects one or more bit lines BLs corresponding to the address, and applies the writing drain voltage Vdp or the reading drain voltage Vdr to the selected bit lines BLs. An unselected bit line voltage (the reference voltage Vss, for example) is applied to the unselected bit line BL.

When an address of the memory cell as a target of the operation has been assigned at the writing operation time and the reading operation time, the word line decoder 25 performs selection and non-selection of the first word line WPL for the writing operation and the second word line WRL for the reading operation corresponding to the address, in accordance with a type of the operation. Specifically, at the writing operation time, the word line decoder 25 applies the second writing gate voltage Vgp2 as a selected first word line voltage to one selected first word line WPL, applies the second reading gate voltage Vgr2 as an unselected first word line voltage to the remaining (m−1) unselected first word lines WPLs, and applies the third writing gate voltage Vgp3 as an unselected second word line voltage to all the second word lines WRL. At the reading operation time, the word line decoder 25 applies the third reading gate voltage Vgr3 as a selected second word line voltage to one selected second word line WRL, applies the third writing gate voltage Vgp3 as an unselected second word line voltage to the remaining (m−1) unselected second word lines WRL, and applies the second reading gate voltage Vgr2 as an unselected first word line voltage to all the first word lines WPLs.

When an address of the memory cell as a target of the writing operation has been assigned at the writing operation time, the memory gate control circuit 26 selects one memory gate line MGL corresponding to the address, applies the first writing gate voltage Vgp1 as a selected memory gate line voltage to the selected memory gate line MGL, and applies the first reading gate voltage Vgr1 as an unselected memory gate line voltage to the remaining (m−1) unselected memory gate lines MGLs. At the writing operation time, the first writing gate voltage Vgp1 may be applied to all the memory gate lines MGLs. Further, at the reading operation time, the memory gate control circuit 26 applies the first reading gate voltage Vgr1 to all the memory gate lines MGLs.

The sense amplifier circuit 27 detects the reading current Idsr that flows from the selected bit line BL to the selected memory cell 1 via the bit line decoder 24, and decides whether the memory transistor Qm of the selected memory cell 1 is in the first state or the second state. The sense amplifier circuit 27 is configured to include sense amplifiers of the same number as that of the selected bit lines BL. The sense amplifier configuring the sense amplifier circuit 27 may not be a current-sense type sense amplifier that directly detects the reading current Idsr but may be a voltage-sense type sense amplifier that detects a node voltage on the current path of the reading current Idsr of the bit line BL or the bit line decoder 24 that changes corresponding to the reading current Idsr. Further, the sense amplifier circuit 27 may be in the circuit configuration connected to the reference voltage line VSL in a column unit by independently providing the reference voltage line VSL in each column, in place of the circuit configuration connected to the selected bit line BL via the bit line decoder 24.

By the circuit configuration illustrated in FIG. 12 or FIG. 13, the selected memory cell 1 is brought into the first or second voltage application state described in the first embodiment, and the memory transistor Q1 in the selected memory cell 1 transits from the first state to the second state at the writing operation time. In the memory cell 1 of the unselected row, the second reading gate voltage Vgr2 (Vgr2<Vth1 or Vgr2<Vn3+Vth1) as an unselected first word line voltage is applied to the gate of the first selection transistor Q1, the third writing gate voltage Vgp3 (Vgp3<Vth2 or Vgp3<Vn3+Vth2) as the unselected second word line voltage is applied to the gate of the second selection transistor Q2, both the first and second selection transistors Q1 and Q2 are brought into the OFF state, the writing current Idsp does not flow to the memory transistor Q1, and the first or the second state of the memory transistor Q1 is maintained as it is. Further, in the memory cell 1 of the unselected column, since the same reference voltage Vss as that in the reference voltage line VSL is applied to the unselected bit line BL, the writing current Idsp does not flow in the memory transistor Q1 even in the selected row, and the first or second state of the memory transistor Q1 is maintained as it is.

Further, by the circuit configuration illustrated in FIG. 12 or FIG. 13, the selected memory cell 1 is brought into the third or fourth voltage application state described in the first embodiment at the reading operation time. When the memory transistor Q1 in the selected memory cell 1 is in the first state, the reading current Idsr does not flow from the selected bit line BL to the memory cell 1. When the memory transistor Q1 in the selected memory cell 1 is in the second state, the reading current Idsr flows from the selected bit line BL to the memory cell 1. In the memory cell 1 of the unselected row, the second reading gate voltage Vgr2 (Vgr2<Vth1 or Vgr2<Vn3+Vth1) as an unselected first word line voltage is applied to the gate of the first selection transistor Q1, the third writing gate voltage Vgp3 (Vgp3<Vth2 or Vgp3<Vn3+Vth2) as the unselected second word line voltage is applied to the gate of the second selection transistor Q2, and both the first and second selection transistors Q1 and Q2 are brought into the OFF state. The reading current Idsp does not flow from the selected bit line BL via the memory cell 1 of the unselected row regardless of the state of the memory transistor Q1. Further, in the memory cell 1 of the unselected column, since the same reference voltage Vss as that in the reference voltage line VSL is applied to the unselected bit line BL, the reading current Idsp does not flow in the memory transistor Q1 even in the selected row. In the present embodiment, even when a certain current has flown in the unselected bit line BL, the current that flows in the unselected bit line BL is not detected by the sense amplifier circuit 27 because the unselected bit line BL and the sense amplifier circuit 27 are separated from each other.

A detailed circuit configuration, a device structure, and a manufacturing method of the control circuit 22, the voltage generation circuit 23, the bit line decoder 24, the word line decoder 25, the memory gate control circuit 26, and the sense amplifier circuit 27 can be realized by using known circuit configurations, and the production is possible by using known semiconductor manufacturing techniques. Therefore, their description will be omitted.

The present memory device 20 consumes low power and can be made compact because writing to the memory cell 1 with a small current and at a low voltage is possible.

Next, as a modification of the present memory device 20 according to the second embodiment, description will be made on present memory devices 30, 40, and 50 of third to fifth embodiments. Each of the devices includes a memory cell array in one row or one column by arranging the plurality of memory cell 1 illustrated in FIG. 1 in any one direction of the row direction or the column direction. In the third to fifth embodiments, it is assumed that the present memory devices 30, 40, and 50 are used as relatively small-capacity nonvolatile memory devices used in a peripheral circuit such as a display device, a data processing device, and a logic circuit device.

Third Embodiment

Figure 14:
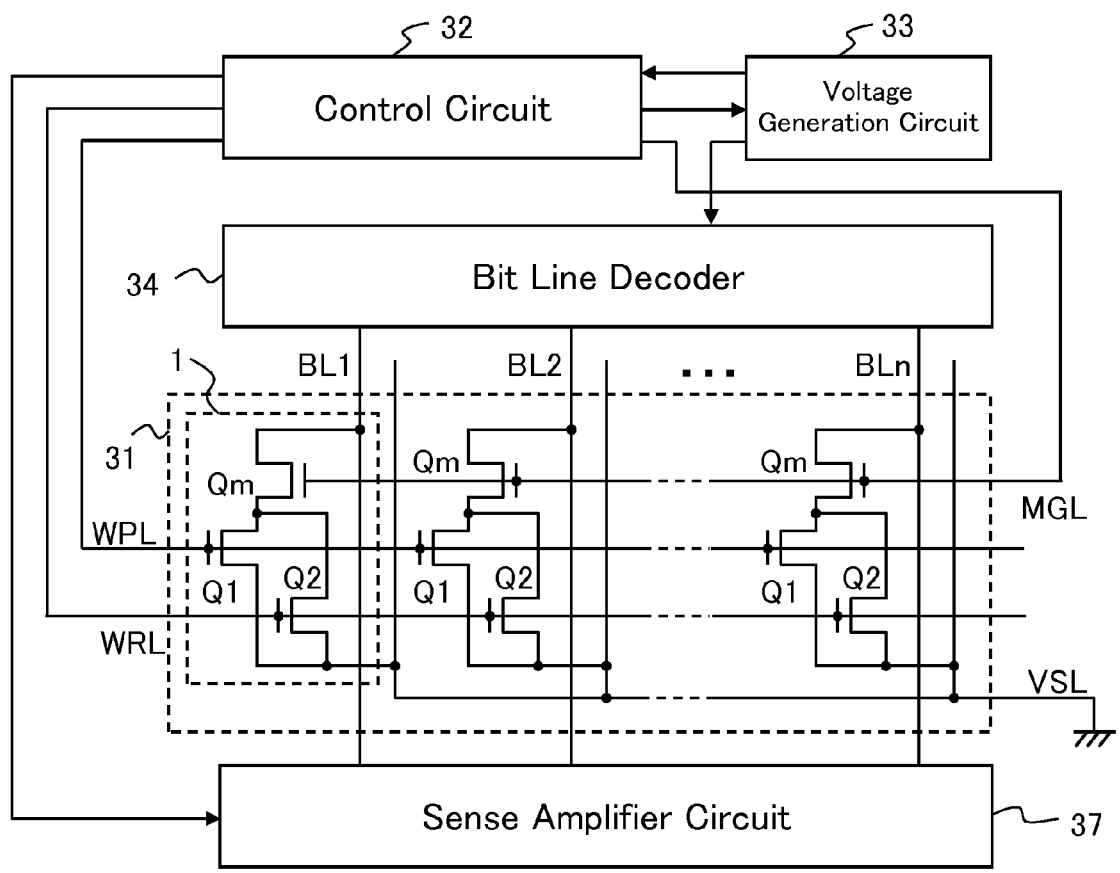
FIG. 14 is a circuit block diagram schematically illustrating a configuration example of a memory cell array and a peripheral circuit in a non-volatile memory device according to a third embodiment of the present invention.

In the third embodiment, description will be made on the present memory device 30 including a memory cell array 31 configured by having the plurality of memory cells 1 illustrated in FIG. 1 arranged in the row direction. FIG. 14 illustrates a schematic circuit block configuration of the present memory device 30. As illustrated in FIG. 14, the present memory device 30 includes the memory cell array 31, a control circuit 32, a voltage generation circuit 33, a bit line decoder 34, and a sense amplifier circuit 37.

The memory cell array 31 is configured by having n memory cells 1 arranged in the row direction, and further includes a memory gate line MGL extending in the row direction, a first word line WPL extending in the row direction, a second word line WRL extending in the row direction, n bit lines BL0 to BLn extending in the column direction, and a reference voltage line VSL. The memory cell array 31 corresponds to one row of the memory cell array 21 of m rows times n columns in the second embodiment.

In the third embodiment, the memory gate line MGL, the first word line WPL, and the second word line WRL are each one line. Therefore, the word line decoder 25 and the memory gate control circuit 26 including the row selection function like in the second embodiment are not necessary. Each signal voltage to the memory gate line MGL, the first word line WPL, and the second word line WRL is supplied from the control circuit 32. The bit line decoder 34 and the sense amplifier circuit 37 are the same as the bit line decoder 24 and the sense amplifier circuit 27 in the second embodiment, and therefore, redundant description will be omitted.

The control circuit 32 controls the writing operation and the reading operation of the memory cells 1 in the memory cell array 31. Specifically, the control circuit 32 controls the voltage generation circuit 33, the bit line decoder 34, and the sense amplifier circuit 37, based on an address signal input from an address line (not illustrated), a data input which is input from a data line, and a control input signal input from a control signal line. At the same time, the control circuit 32 supplies the memory gate line MGL, the first word line WPL, and the second word line WRL with each signal voltage.

In the writing operation and the reading operation, the voltage generation circuit 33 generates the first to third writing gate voltages Vgp1, Vgp2, and Vgp3 at the writing operation time, and the first to third reading gate voltages Vgr1, Vgr2, and Vgr3 at the reading operation time described in the first embodiment, and supplies the control circuit 32 with these gate voltages. Further, the voltage generation circuit 33 generates the bit line voltage necessary to write and read the memory cell 1 selected as a target of the operation, and supplies the bit line decoder 24 with the bit line voltage. The bit line voltage corresponds to the writing drain voltage Vdp at the writing operation time and the reading drain voltage Vdr at the reading operation time described in the first embodiment.

At the writing operation time, the control circuit 32 applies the first writing gate voltage Vgp1 to the memory gate line MGL, applies the second writing gate voltage Vgp2 to the first word line WPL, and applies the third writing gate voltage Vgp3 to the second word line WRL. At the reading operation time, the control circuit 32 applies the first reading gate voltage Vgr1 to the memory gate line MGL, applies the second reading gate voltage Vgr2 to the first word line WPL, and applies the third reading gate voltage Vgr3 to the second word line WRL.

Figure 15:
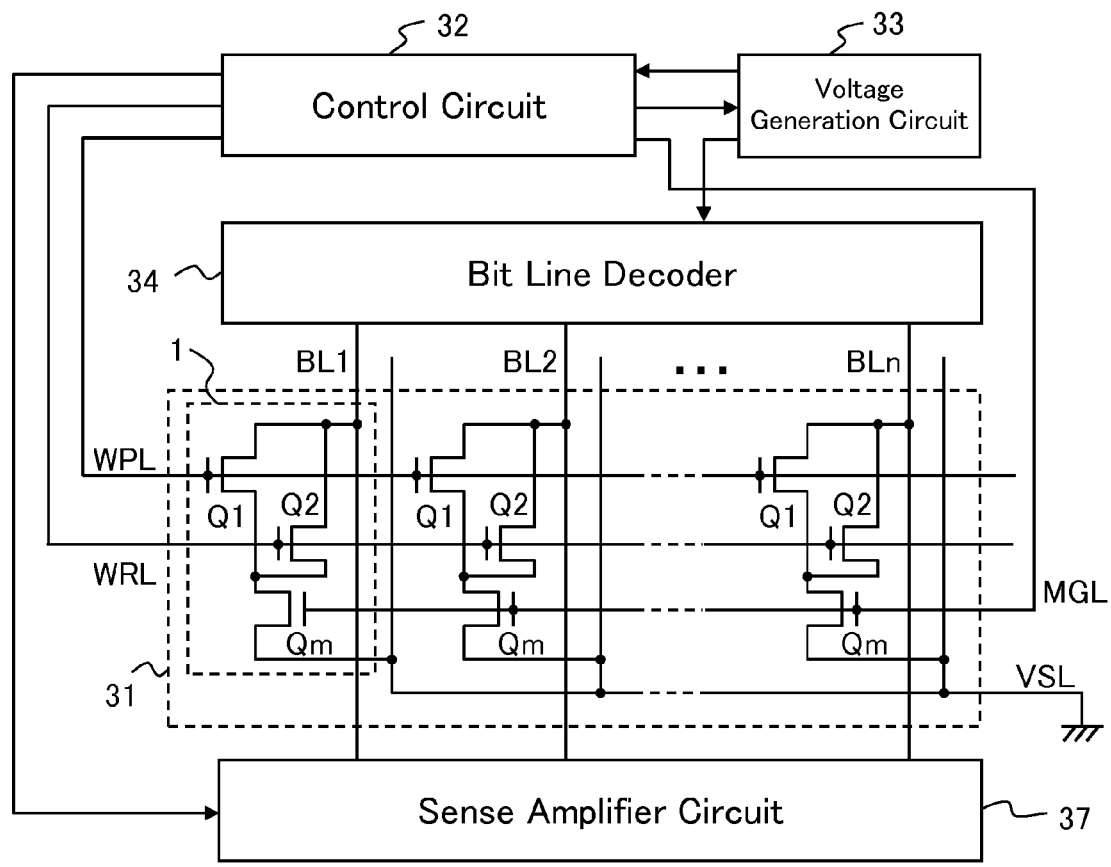
FIG. 15 is a circuit block diagram schematically illustrating another configuration example of a memory cell array and a peripheral circuit in a non-volatile memory device according to the third embodiment of the present invention.

The configuration of the memory cell array 31 illustrated in FIG. 14 assumes the first voltage application state at the writing operation time and the third voltage application state at the reading operation time described in the first embodiment. In the case where the second voltage application state at the writing operation time and the fourth voltage application state at the reading operation time described in the first embodiment are assumed, as described above, in each memory cell 1, the source of the memory transistor Qm configures the node N0, the drain of the first selection transistor Q1 configures the node N1, and the drain of the second selection transistor Q2 configures the node N2. As illustrated in FIG. 15, each of the bit lines BL0 to BLn is connected to each source (the nodes N1 and N2) of the first and second selection transistors Q1 and Q2 of the memory cell 1 of the corresponding column. The reference voltage line VSL is connected in common to the sources (the node N0) of the memory transistors Qm of all the memory cells 1.

Fourth Embodiment

Figure 16:
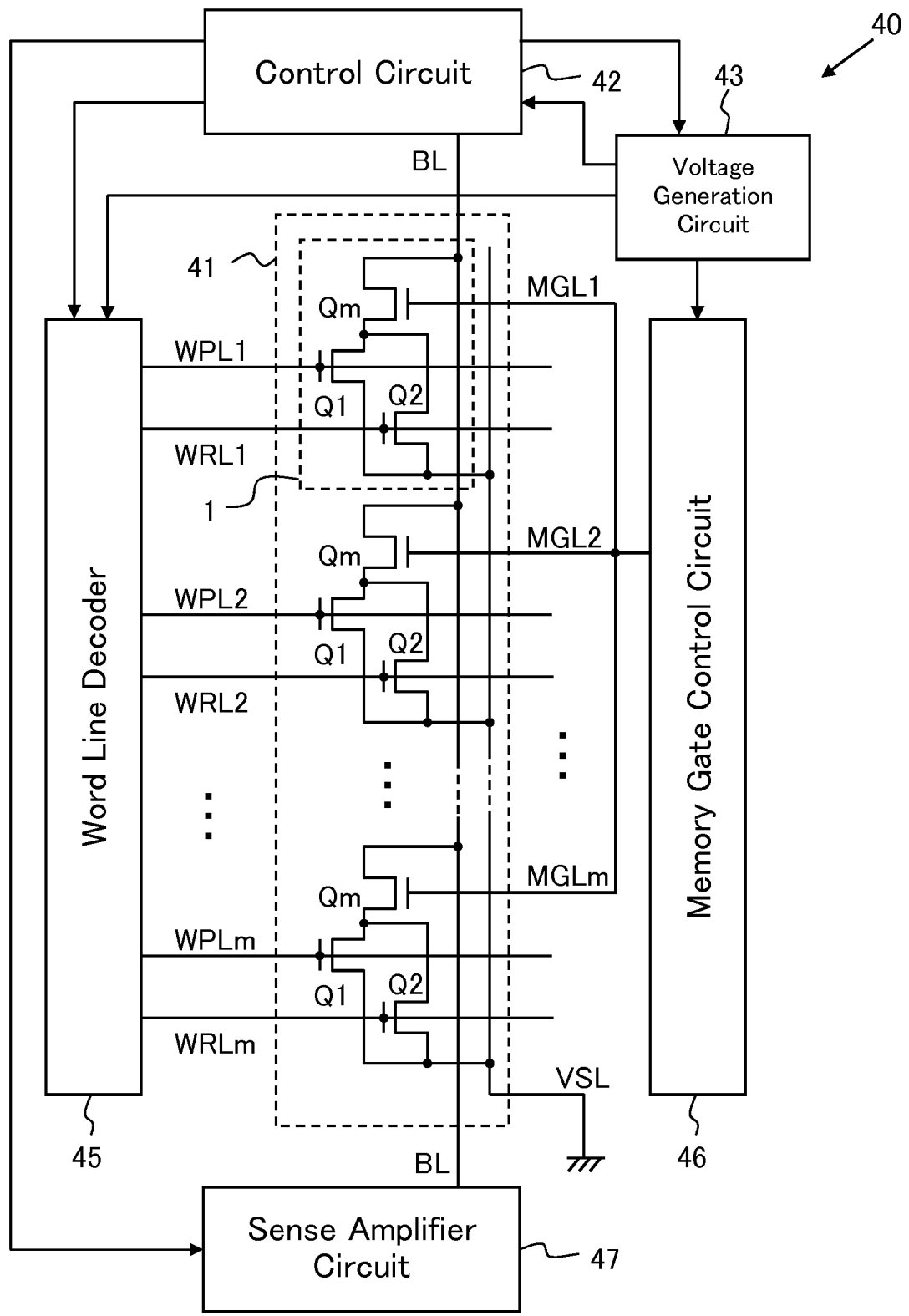
FIG. 16 is a circuit block diagram schematically illustrating a configuration example of a memory cell array and a peripheral circuit in a non-volatile memory device according to a fourth embodiment of the present invention.

In the fourth embodiment, description will be made on the present memory device 40 including a memory cell array 41 configured by having the plurality of memory cells 1 illustrated in FIG. 1 arranged in the column direction. FIG. 16 illustrates a schematic circuit block configuration of the present memory device 40. As illustrated in FIG. 16, the present memory device 40 includes the memory cell array 41, a control circuit 42, a voltage generation circuit 43, a word line decoder 45, a memory gate control circuit 46, and a sense amplifier circuit 47.

The memory cell array 41 is configured by having m memory cells 1 arranged in the column direction, and further includes m memory gate lines MGL1 to MGLm extending in the row direction, m first word lines WPL1 to WPLm extending in the row direction, m second word lines WRL1 to WRLm extending in the row direction, a bit line BL extending in the column direction, and a reference voltage line VSL. In the fourth embodiment, the memory gate lines MGL1 to MGLm are collected as one memory gate line MGL, and the memory gate line MGL is connected to the memory gate control circuit 46. The memory cell array 41 corresponds to one column of the memory cell array 21 of m rows times n columns in the second embodiment.

In the fourth embodiment, because the bit line BL is one line, the bit line decoder 24 including the column selection function like in the second embodiment is not necessary. The writing drain voltage Vdp and the reading drain voltage Vdr as a bit line voltage are applied from the control circuit 32 to the bit line BL. The voltage generation circuit 43, the word line decoder 45, the memory gate control circuit 46, and the sense amplifier circuit 47 are basically the same as the voltage generation circuit 23, the word line decoder 25, the memory gate control circuit 26, and the sense amplifier circuit 27 in the second embodiment, and therefore, redundant description will be omitted. In the fourth embodiment, the bit line voltage is applied to the control circuit 42. In FIG. 16, there is exemplified a case where, at the writing operation time, the memory gate control circuit 46 does not select the row, and applies the first writing gate voltage Vgp1 to one memory gate line MGL (the m memory gate lines MGL1 to MGLm). However, similarly to the second embodiment, by individually controlling selection and non-selection of the m memory gate lines MGL1 to MGLm, the first writing gate voltage Vgp1 may be applied to the selected memory gate line MGL, and the first reading gate voltage Vgr1 may be applied to the unselected memory gate line MGL.

The control circuit 42 controls the writing operation and the reading operation of the memory cells 1 in the memory cell array 41. Specifically, the control circuit 42 controls the voltage generation circuit 43, the word line decoder 45, the memory gate control circuit 46, and the sense amplifier circuit 47, based on an address signal input from an address line (not illustrated), a data input which is input from a data line, and a control input signal input from a control signal line. At the same time, the control circuit 42 supplies the bit line BL with the writing drain voltage Vdp or the reading drain voltage Vdr.

Figure 17:
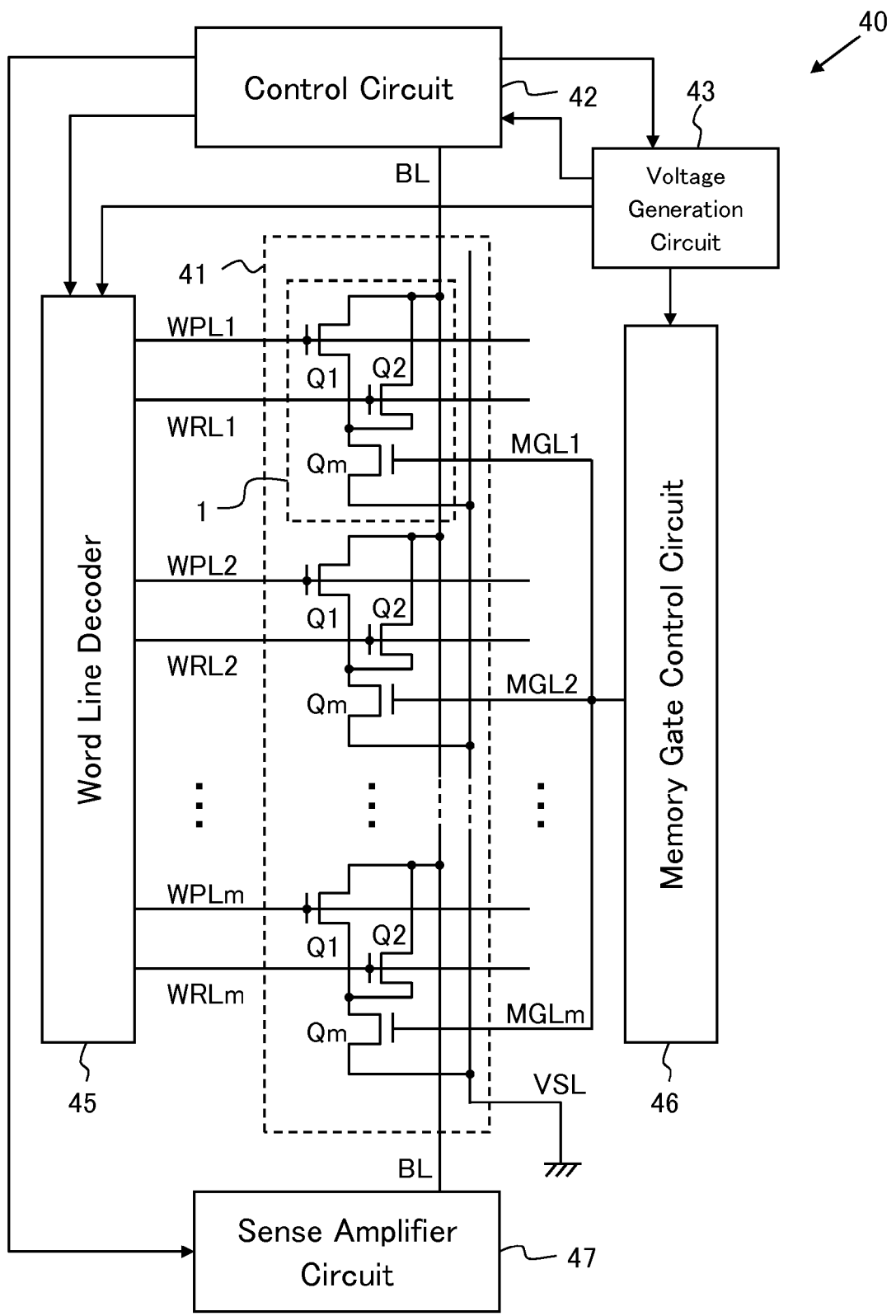
FIG. 17 is a circuit block diagram schematically illustrating another configuration example of a memory cell array and a peripheral circuit in a non-volatile memory device according to the fourth embodiment of the present invention.

The configuration of the memory cell array 41 illustrated in FIG. 16 assumes the first voltage application state at the writing operation time and the third voltage application state at the reading operation time described in the first embodiment. In the case where the second voltage application state at the writing operation time and the fourth voltage application state at the reading operation time described in the first embodiment are assumed, as described above, in each memory cell 1, the source of the memory transistor Qm configures the node N0, the drain of the first selection transistor Q1 configures the node N1, and the drain of the second selection transistor Q2 configures the node N2. As illustrated in FIG. 17, the bit line BL is connected in common to each source (the nodes N1 and N2) of the first and second selection transistors Q1 and Q2 of all the memory cells 1. The reference voltage line VSL is connected in common to the sources (the node N0) of the memory transistors Qm of all the memory cells 1.

Fifth Embodiment

Figure 18:
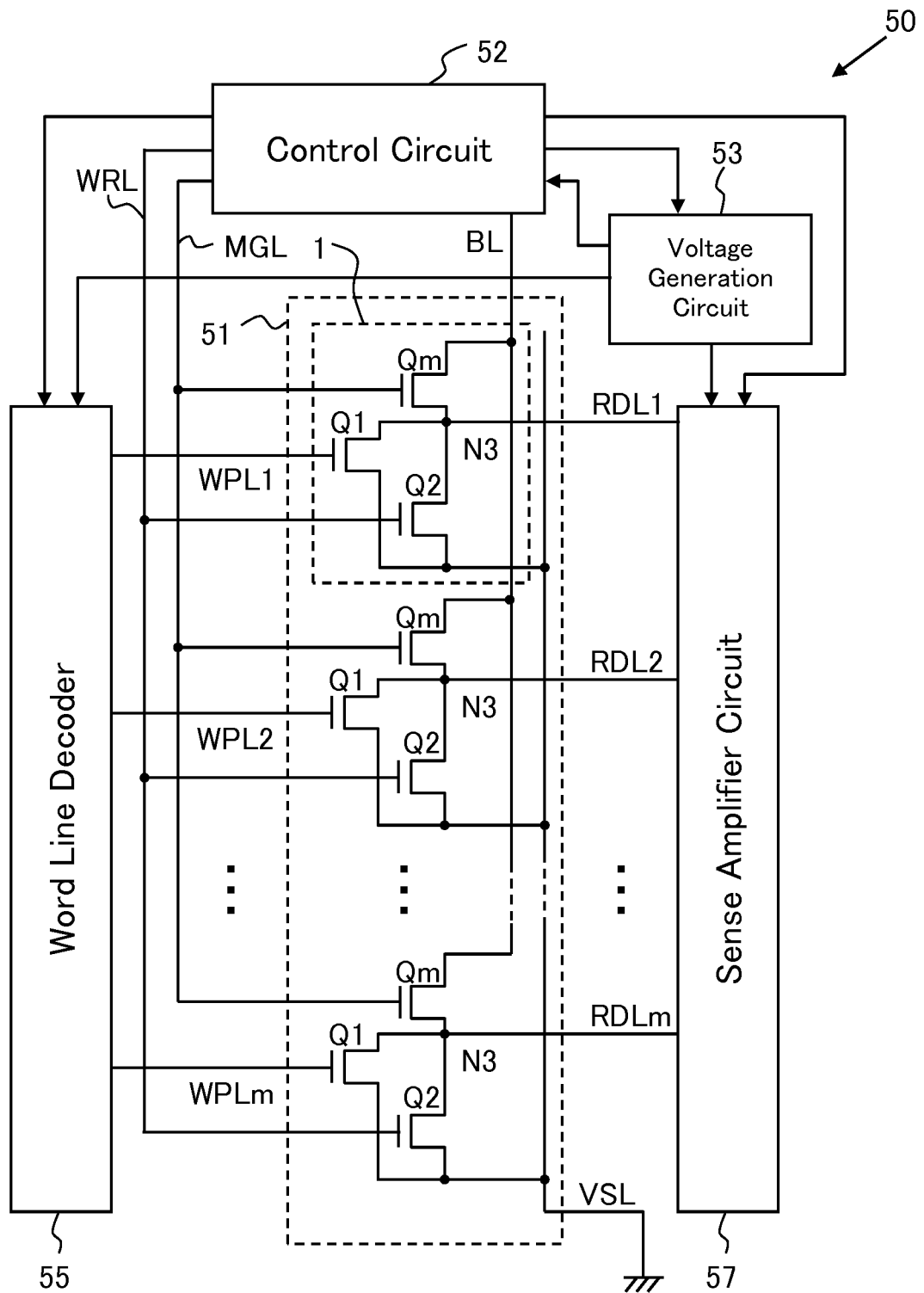
FIG. 18 is a circuit block diagram schematically illustrating a configuration example of a memory cell array and a peripheral circuit in a non-volatile memory device according to a fifth embodiment of the present invention.

In the fifth embodiment, description will be made on the present memory device 50 including a memory cell array 51 configured by having the plurality of memory cells 1 illustrated in FIG. 1 arranged in the column direction. FIG. 18 illustrates a schematic circuit block configuration of the present memory device 50. As illustrated in FIG. 18, the present memory device 50 includes the memory cell array 51, a control circuit 52, a voltage generation circuit 53, a word line decoder 55, and a sense amplifier circuit 57.

The memory cell array 51 is configured by having m memory cells 1 arranged in the column direction, and further includes a memory gate line MGL, m first word lines WPL1 to WPLm extending in the row direction, a second word line WRL, a bit line BL extending in the column direction, a reference voltage line VSL, and m reading data lines RDL1 to RDLm. The memory cell array 51 corresponds to one column of the memory cell array 21 of m rows times n columns in the second embodiment.

In the fifth embodiment, the bit line BL, the memory gate line MGL, and the second word line WRL are each one line. Therefore, the bit line decoder 24 including the column selection function, the memory gate control circuit 26 including the row selection function, and the word line decoder 25 including the row selection function to the second word line WRL like in the second embodiment are not necessary. The writing drain voltage Vdp and the reading drain voltage Vdr to be applied to the bit line BL, the first writing gate voltage Vgp1 and the first reading gate voltage Vgr1 to be applied to the memory gate line MGL, and the third writing gate voltage Vgp3 and the third reading gate voltage Vgr3 to be applied to the second word line WRL are supplied respectively to the bit line BL, the memory gate line MGL, and the second word line WRL from the control circuit 52. Since the voltage generation circuit 53 is the same as the voltage generation circuit 23 in the second embodiment, redundant description will be omitted.

The control circuit 52 controls the writing operation and the reading operation of the memory cells 1 in the memory cell array 51. Specifically, the control circuit 52 controls the voltage generation circuit 53, the word line decoder 55, and the sense amplifier circuit 57, based on an address signal input from an address line (not illustrated), a data input which is input from a data line, and a control input signal input from a control signal line. At the same time, the control circuit 52 applies each of the above voltages to the bit line BL, the memory gate line MGL, and the second word line WRL.

The word line decoder 55 does not include the row selection function at the reading operation time. The word line decoder 55 performs selection and non-selection of the first word lines WPL1 to WPLm, and selects one memory cell 1 as a target of writing, only at the writing operation time.

In the fifth embodiment, the writing operation is sequentially executed by selecting the memory cells 1 one by one, and the reading operation is executed collectively by simultaneously selecting m memory cells 1. Therefore, the internal nodes N3 of the memory cells 1 in each row are respectively connected to m reading data lines RDL0 to RDLm, and the reading data lines RDL1 to RDLm are connected to the sense amplifier circuit 57 consisting of m sense amplifiers. Since each sense amplifier is the same as the sense amplifier circuit 27 in the second embodiment, redundant description will be omitted.

As a modification of the fifth embodiment, in the reading operation, by selecting a part of the memory cells 1 out of the m memory cells 1, the reading operation may be performed simultaneously to the selected memory cells 1. In this case, m second word lines WRL1 to WRLm are provided, and the word line decoder 55 is configured to select one or more second word lines from the second word lines WRL1 to WRLm and not to select the remaining second word lines WRL at the reading operation time. Then, the sense amplifier circuit 57 is configured by the same number of sense amplifiers as the number of the second word lines WRL selected simultaneously.

Figure 19:
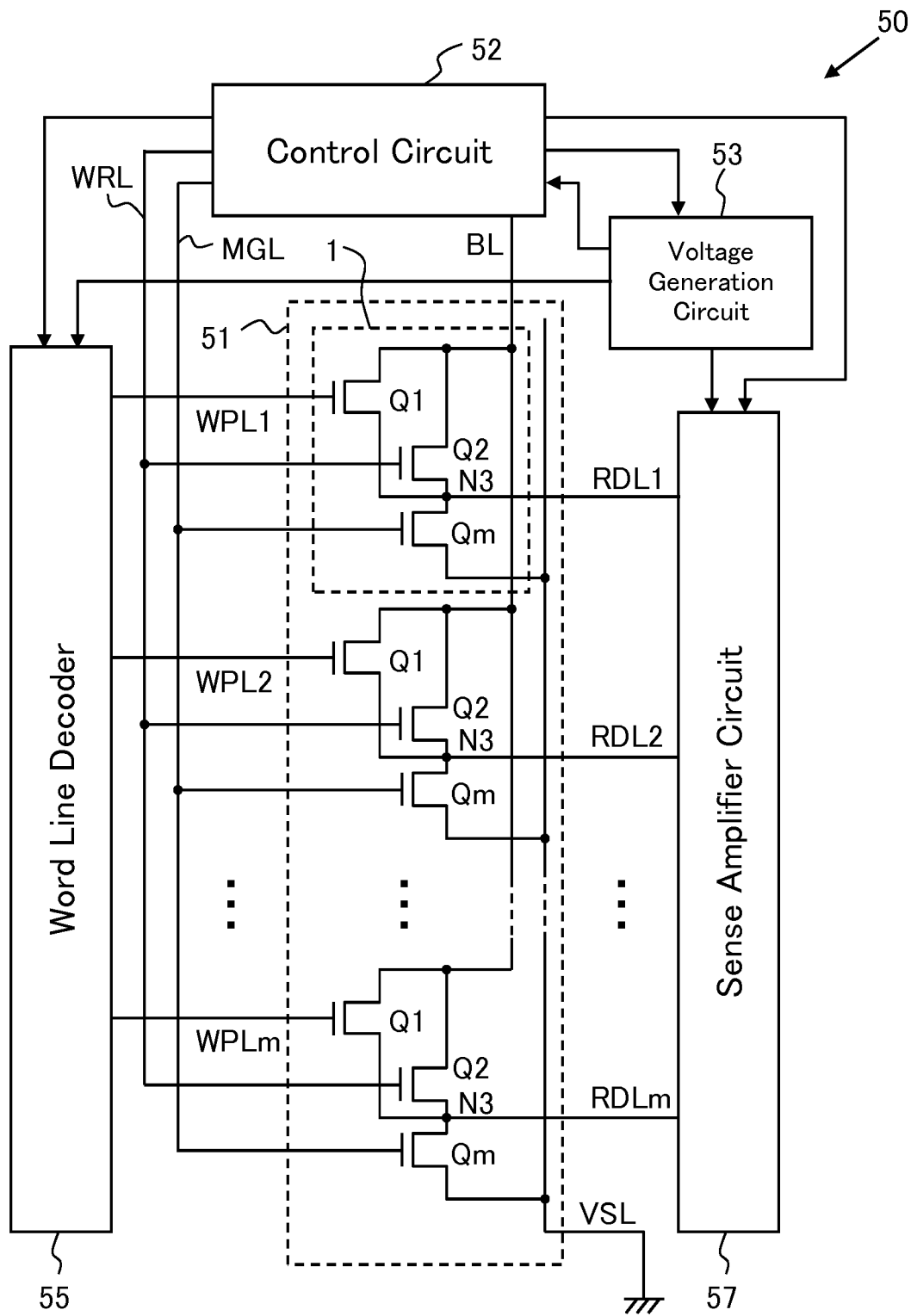
FIG. 19 is a circuit block diagram schematically illustrating another configuration example of a memory cell array and a peripheral circuit in a non-volatile memory device according to the fifth embodiment of the present invention.

The configuration of the memory cell array 51 illustrated in FIG. 18 assumes the first voltage application state at the writing operation time and the third voltage application state at the reading operation time described in the first embodiment. In the case where the second voltage application state at the writing operation time and the fourth voltage application state at the reading operation time described in the first embodiment are assumed, as described above, in each memory cell 1, the source of the memory transistor Qm configures the node N0, the drain of the first selection transistor Q1 configures the node N1, and the drain of the second selection transistor Q2 configures the node N2. As illustrated in FIG. 19, the bit line BL is connected in common to each source (the nodes N1 and N2) of the first and second selection transistors Q1 and Q2 of all the memory cells 1. The reference voltage line VSL is connected in common to the sources (the node N0) of the memory transistors Qm of all the memory cells 1.

Sixth Embodiment

In the second to fifth embodiments, the description has been made on the cases where the memory cell arrays 21 to 51 are configured by having the plurality of memory cells 1 illustrated in FIG. 1 arranged in at least one direction of the row direction and the column direction. In the sixth embodiment, description will be made on an example of having the memory cell 1 illustrated in FIG. 1 assembled at one or more positions in a logic circuit as the circuit cell 2.

Figure 20:
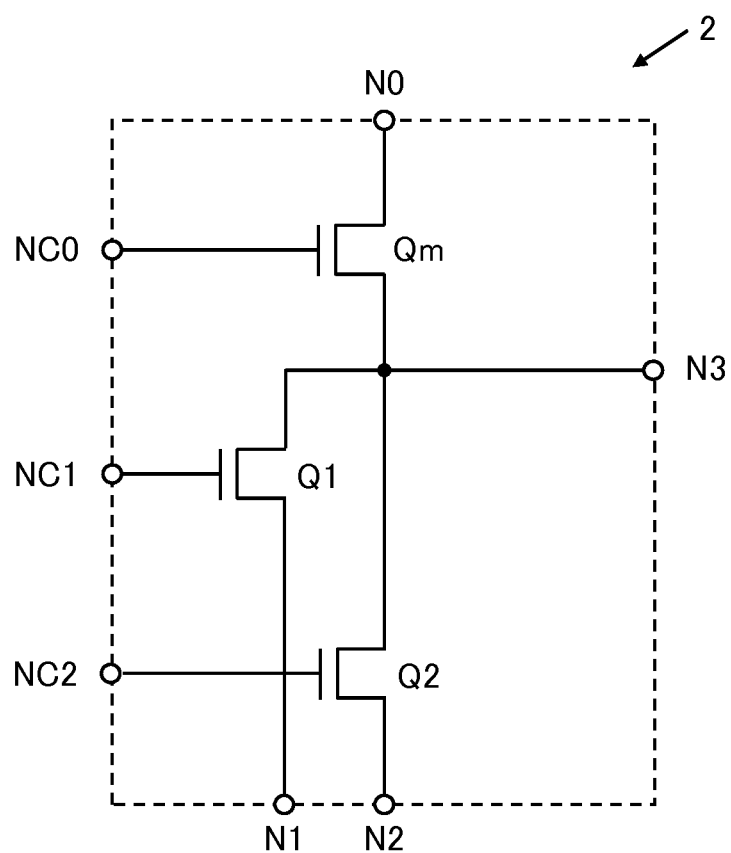
FIG. 20 is an equivalent circuit diagram illustrating a configuration of a circuit cell in a non-volatile memory device according to a sixth embodiment of the present invention.

FIG. 20 illustrates a circuit configuration of the circuit cell 2. The circuit cell 2 is substantially the same as the memory cell 1 illustrated in FIG. 1. Before the writing operation of the memory transistor Qm, the circuit cell 2 functions as an inverter that has the control node NC2 as an input terminal and that has the internal node N3 as an output terminal. Further, the circuit cell 2 functions as a ROM cell in which the output level corresponding to the state of the memory transistor Qm before and after the writing operation of the memory transistor Qm (the first state before the writing operation, or the second state after the writing operation) is fixedly output from the output terminal.

Figure 21:
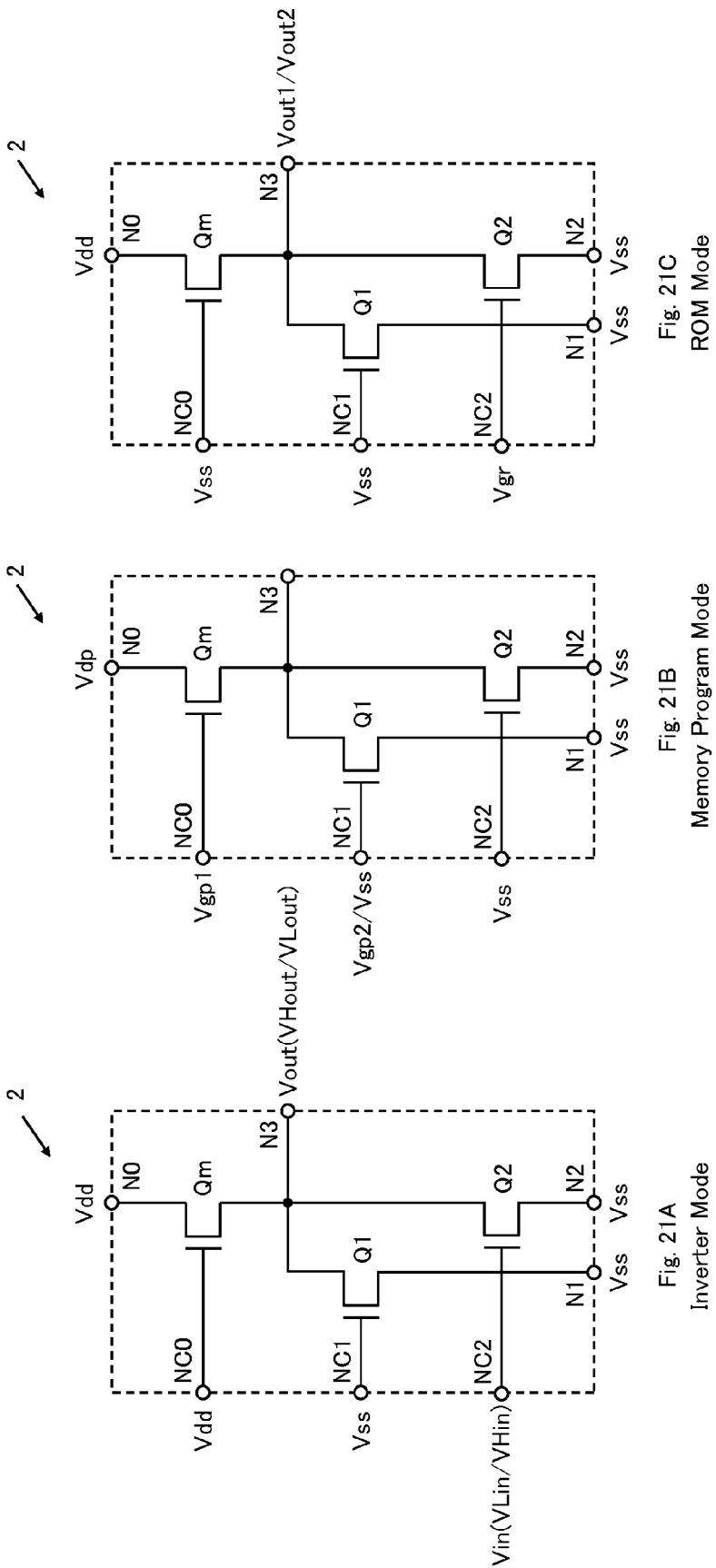
FIGS. 21A to 21C are diagrams illustrating voltage application states in an inverter mode, a memory program mode, and a ROM mode to the circuit cell illustrated in FIG. 20, respectively.

FIG. 21A illustrates the voltage application state before the writing operation when the circuit cell 2 functions as the inverter (the inverter mode). FIG. 21B illustrates the voltage application state at the writing operation time and at the writing non-operation time in the memory program mode. FIG. 21C illustrates the voltage application state at the reading operation time when the circuit cell 2 functions as the ROM cell (the ROM mode). FIG. 22 is a table of the voltage application state in each mode and the output levels of the output terminal. In the voltage application state illustrated in FIGS. 21A to 21C, the threshold voltages Vth1 and Vth2 of the first and second selection transistors Q1 and Q2 are respectively positive voltages (Vth1>0, Vth2>0), and the reference voltage Vss is the ground voltage (Vss=0 V).

In the inverter mode, the power supply voltage Vdd substantially the same as the reading drain voltage Vdr described in the first embodiment is applied to the node N0 and the control node NC0, and the memory transistor Qm is in the ON state. The reference voltage Vss (the ground voltage, for example) is applied to the node N1 and the node N2. The reference voltage Vss is applied to the control node NC1, and the first selection transistor Q1 is in the OFF state. An input voltage Vin (VLin or VHin) corresponding to binary input data is applied to the control node NC2. At the input time of the low level input voltage VLin, the second selection transistor Q2 is brought into the OFF state. The high level output voltage VHout is output to the node N3 as an output terminal. At the input time of the high level input voltage VHin, the second selection transistor Q2 is brought into the ON state, and the low level output voltage VLout is output to the node N3 as an output terminal. In this case, since the memory transistor Qm is the n-channel type transistor, the high level output voltage VHout becomes a voltage value (Vdd−Vthm) as a voltage drop from the power supply voltage Vdd by the threshold voltage Vthm. The low level output voltage VLout is determined as a voltage value when the drain current at the time of the source voltage of the memory transistor Qm being the output voltage VLout becomes equal to the drain current at the time of the drain voltage of the second selection transistor Q2 being the output voltage VLout. The element design condition (at least one of the channel width, the channel length, and the threshold voltage) of the memory transistor Qm and the second selection transistor Q2 is set such that the low level output voltage VLout becomes at a sufficiently low level.

The voltage application state at the writing operation time in the memory program mode is the same as the first voltage application state at the writing operation time described in the first embodiment, and therefore, redundant description will be omitted. The voltage application state at the writing non-operation time in the memory program mode is set such that at least one of the memory transistor Qm and the first selection transistor Q1 is brought into the OFF state, and flow of the writing current Idsp in the memory transistor Qm is interrupted. In the examples illustrated in FIG. 21B and FIG. 22, the reference voltage Vss is applied to the control node NC1, and the first selection transistor Q1 is in the OFF state, as an example. Accordingly, in the memory program mode, the writing current Idsp flows in the memory transistor Qm based on the voltage application state at the writing operation time, and the memory transistor Qm transits from the first state to the second state. On the other hand, the writing current Idsp does not flow in the memory transistor Qm based on the voltage application state at the writing non-operation time. Therefore, the memory transistor Qm is maintained in the first state.

In the ROM mode, the power supply voltage Vdd substantially the same as the reading drain voltage Vdr described in the first embodiment is applied to the node N0, and the reference voltage Vss is applied to the control node NC0. The memory transistor Qm is brought into the OFF state in the first state of not yet writing. A current which is proportional to the voltage between the node N0 and the internal node N3 flows in the memory transistor Qm as the resistance element in the second state after the writing, regardless of the voltage value of the control node NC0. The reference voltage Vss is applied to the node N1 and the node N2. The reference voltage Vss is applied to the control node NC1, and the first selection transistor Q1 is in the OFF state. A predetermined reading gate voltage Vgr is applied to the control node NC2, and the second selection transistor Q2 is brought into the ON state. An output voltage Vout1 or Vout2 corresponding to a state of the memory transistor Qm (the first state or the second state) is output to the node N3 as the output terminal. In this case, the output voltage Vout1 when the memory transistor Qm is in the first state becomes the reference voltage Vss (a low level), because the memory transistor Qm is in the OFF state. On the other hand, the output voltage Vout2 when the memory transistor Qm is in the second state is determined as a voltage value when the current ((Vdd−Vout2)/Rm, where Rm is a resistance value of the memory transistor Qm in the second state) flowing in the memory transistor Qm at the time of the internal node N3 being at the output voltage Vout2 becomes equal to the drain current of the second selection transistor Q2. In order that the output voltage Vout2 becomes at a sufficiently high level, the reading gate voltage Vgr is set in accordance with the resistance value Rm of the memory transistor Qm in the second state and the transistor characteristic (the threshold voltage Vth2, the transconductance β2) of the second selection transistor Q2.

In the configuration illustrated in FIG. 20 and FIG. 21C, the circuit cell 2 outputs the output voltage Vout1 or Vout2 of a logic level corresponding to the state of the memory transistor Qm from the internal node N3 as the output terminal, without separately providing the sense amplifier circuit. As a result, the level of an arbitrary node in the logic circuit can be set to a high level or a low level by the processing in the memory program mode of the circuit cell 2.

Seventh Embodiment

Figure 23:
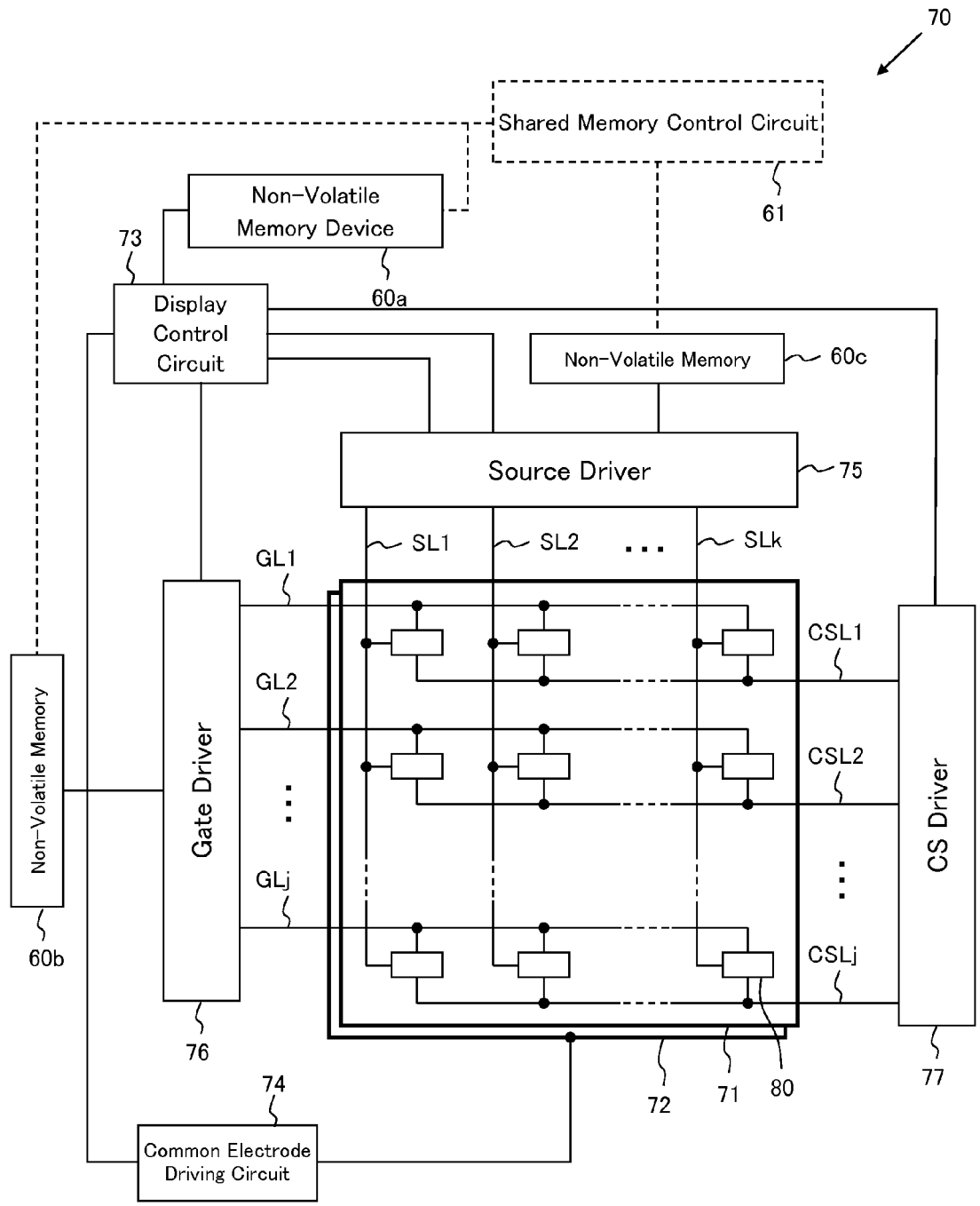
FIG. 23 is an outline block diagram schematically illustrating a configuration example of a liquid crystal display device including the non-volatile memory device according to the present invention.

Description will be made on an example of utilizing, in a liquid crystal display device, the present memory devices 20 to 50 described in the second to fifth embodiments. FIG. 23 is a circuit block diagram illustrating a schematic configuration of a liquid crystal display device 70. As illustrated in FIG. 23, the liquid crystal display device 70 includes an active matrix substrate 71, a common electrode 72, a display control circuit 73, a common electrode driving circuit 74, a source driver 75, a gate driver 76, and a CS driver 77, as conventional configuration of a liquid crystal display device, and further includes non-volatile memory devices 60a, 60b, and 60c.

On the active matrix substrate 71, a plurality of pixel circuits 80 are arranged in the row direction and the column direction so that the pixel circuit array is formed. In the example illustrated in FIG. 23, j pixel circuits 80 in the column direction and k pixel circuits 80 in the row direction, i.e., j×k (j and k are integers equal to or larger than 2) pixel circuits 80 are arranged in a matrix shape. The pixel circuits 80 are connected to one other by source lines SL1 to SLk, gate lines GL1 to GLj, and auxiliary capacitor lines CSL1 to CSLj. In FIG. 23, in order to avoid complexity of the drawing, the pixel circuits 80 are illustrated by blocks. In order to clearly display that various wirings are formed on the active matrix substrate 71, the active matrix substrate 71 is illustrated on the upper side of the common electrode 72 for convenience.

Figure 24:
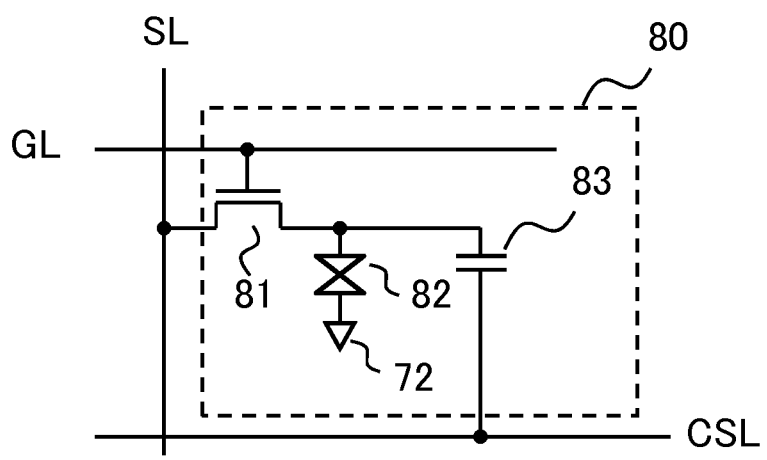
FIG. 24 is an equivalent circuit diagram illustrating a configuration example of a pixel circuit used in the liquid crystal display device illustrated in FIG. 23.

FIG. 24 illustrates a configuration example of one pixel circuit 80. The pixel circuit 80 includes a thin-film transistor 81, a liquid crystal capacitor 82, and an auxiliary capacitor 83. The thin-film transistor 81 is a transistor that plays the role of a switch depending on a signal applied to the gate line GL. One end of each of the gate line GL, the source line SL, and the liquid crystal capacitor 82 and the auxiliary capacitor 83 is connected to the gate terminal, the source terminal, and the drain terminal of the thin-film transistor 81. The other end of the liquid crystal capacitor 82 is connected to the common electrode 72, and the other end of the auxiliary capacitor 83 is connected to the auxiliary capacitor line CSL.

Each of the non-volatile memory devices 60a, 60b, and 60c is configured by any one of the present memory devices 20 to 50. Peripheral circuits such as the control circuits 22, 32, 42, and 52 and the voltage generation circuits 23, 33, 43, and 53 of the non-volatile memory devices 60a, 60b, and 60c may be collectively configured as a shared memory control circuit 61 at one position of a peripheral circuit unit of the liquid crystal display device 70 as illustrated by a broken line in FIG. 23.

The non-volatile memory device 60a stores configuration information and intrinsic IDs and the like of the display panel. These pieces of information stored in the non-volatile memory device 60a are referred to by the display control circuit 73. With these pieces of information, switching of detailed display control methods or optimization of control parameters is performed. The intrinsic IDs can be referred to from the system side connected to the display panel, and are utilized to decide the display panel and select an optimum driving method. The display control circuit 73 realizes optimum display control of a display by switching circuits to be used for the display control based on the information stored in the non-volatile memory device 60a.

The non-volatile memory device 60b stores information on configuration parameters necessary for driving the gate driver, such as redundancy rescue information and the like on the gate driver.

Similarly, the non-volatile memory device 60c stores information on configuration parameters necessary for driving the source driver, such as redundancy rescue information and the like on the source driver.

Detailed circuit configurations and functions of the active matrix substrate 71, the common electrode 72, the display control circuit 73, the common electrode driving circuit 74, the source driver 75, the gate driver 76, and the CS driver 77 are substantially similar to the known configurations of the liquid crystal display devices, and therefore, detailed description will be omitted. The configuration of the pixel circuit 80 is not limited to the configuration exemplified in FIG. 24.

Other Embodiments

Other embodiments of the present memory device will be described below.

Figure 25:
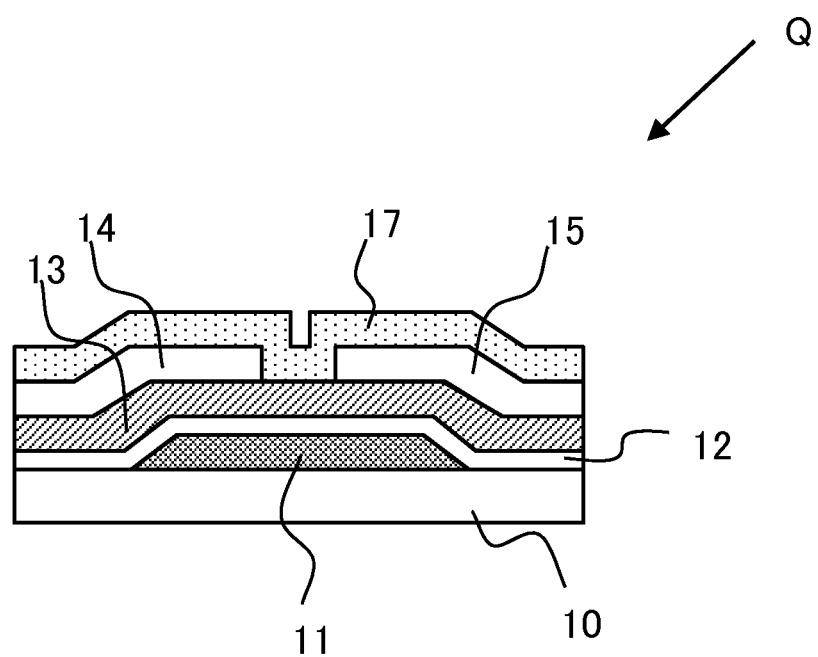
FIG. 25 is a sectional view schematically illustrating another element structure of the transistor which configures the memory cell illustrated in FIG. 1.
Figure 26A:
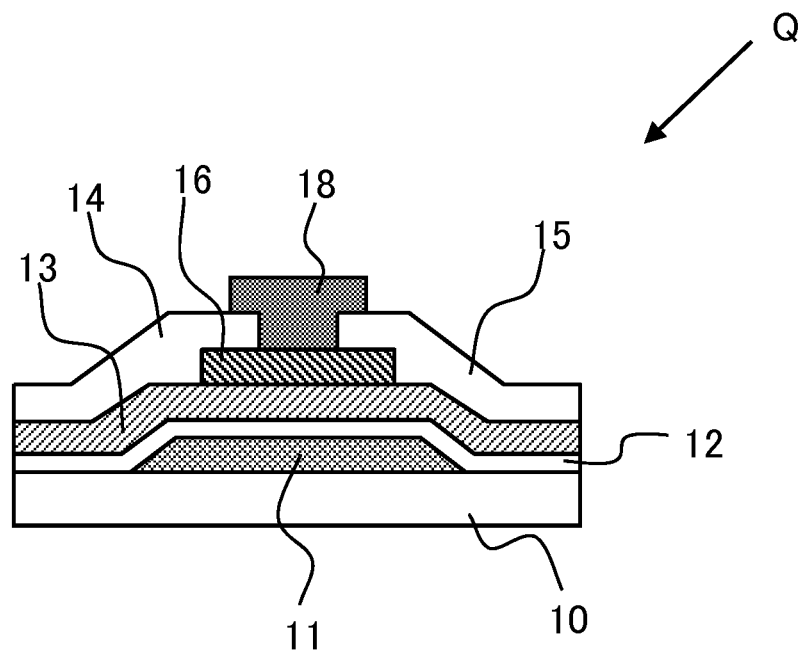
FIGS. 26A and 26B are sectional views schematically illustrating other two element structures of the transistor which configures the memory cell illustrated in FIG. 1.
Figure 26B:
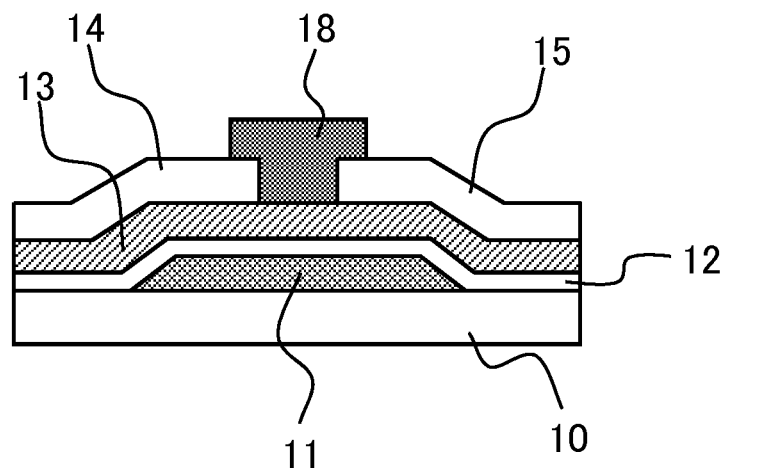

<1> In each of the above embodiments, there has been exemplified the case where the transistor structure of each of the memory transistor Qm and the first and second selection transistors Q1 and Q2 is configured by the bottom-gate type thin-film transistor including the channel etching stopper layer 16 as illustrated in FIG. 2. However, the transistor structure of each of the transistors Qm, Q1, and Q2 (the transistor Q) are not limited to the element structure illustrated in FIG. 2. For example, even in the case of the same bottom-gate type thin-film transistor, as illustrated in FIG. 25, the transistor Q is not necessarily required to include the channel etching stopper layer 16. Further, as illustrated in FIGS. 26A and 26B, the insulation material layer 18 with a high oxygen absorbing rate may be formed on the channel region via the channel etching stopper layer 16, or the insulation material layer 18 with a high oxygen absorbing rate may be formed on the channel region without providing the channel etching stopper layer 16 in the transistor structure illustrated in FIG. 2. The insulation material layer 18 is made to function as an oxygen absorbing layer that absorbs oxygen in the metal oxide semiconductor layer 13 distributed by the writing operation of the memory transistor Qm, and fixes the oxygen not to return again to the inside of the metal oxide semiconductor layer 13. The insulation material layer 18 is a Si-rich CVD silicon oxide film, for example. The channel etching stopper layer 16 may be made of a material similar to that used in the normal metal oxide semiconductor TFT process. In FIGS. 26A and 26B, illustration of the passivation layer 17 is omitted. Further, as illustrated in FIGS. 27A and 27B, the transistor Q may be composed of a top-gate type thin film transistor.

Figure 27A:
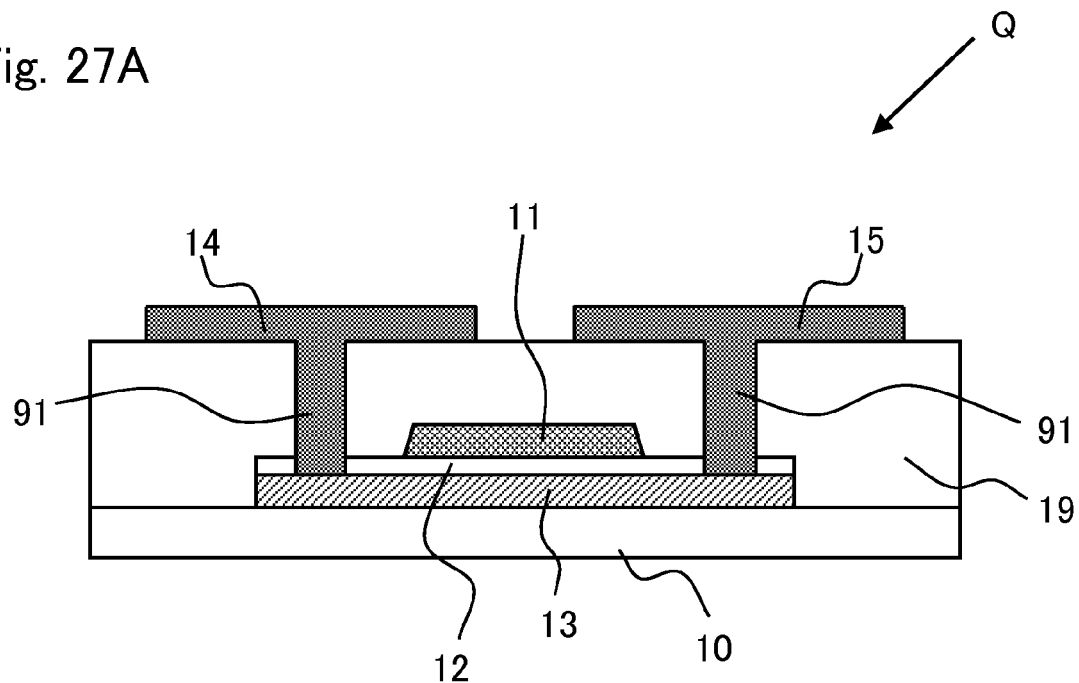
FIGS. 27A and 27B are respectively a sectional view schematically illustrating another element structure of the transistor which configures the memory cell illustrated in FIG. 1, and a layout diagram schematically illustrating a layout example of an upper surface.
Figure 27B:
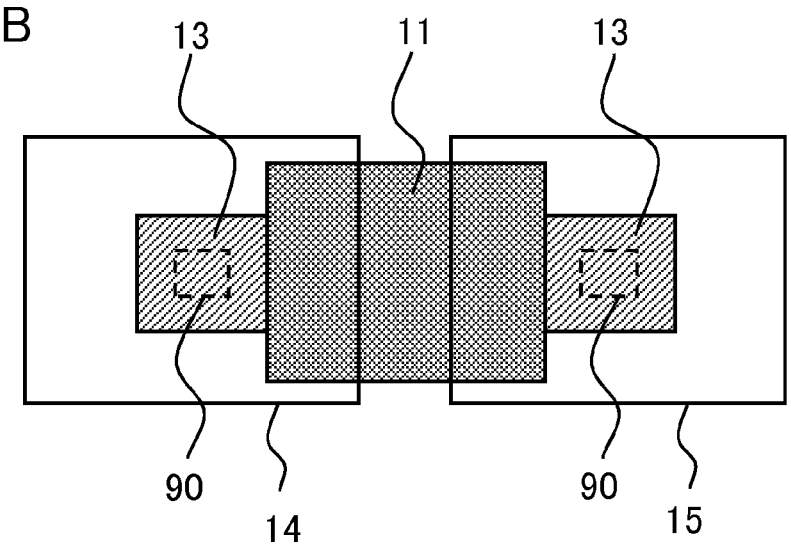

FIG. 27A schematically illustrates a sectional view of the element structure of the transistor Q in the top-gate type thin-film transistor structure. FIG. 27B illustrates a layout example of the upper surface of the transistor Q. The transistor Q has the metal oxide semiconductor layer 13, the gate insulation film 12, and the gate electrode 11 sequentially formed on the glass substrate 10. The source electrode 14 and the drain electrode 15 formed on an insulation film 19 are connected to the metal oxide semiconductor layer 13 via a contact opening part 91 formed in the contact opening formation region (a region 90 in FIG. 27B).

In the memory transistor Qm with the transistor structure illustrated in FIG. 2, FIG. 25, FIGS. 26A-26B, and FIGS. 27A-27B, in order to increase the current density of the current flowing in the metal oxide semiconductor layer 13 in the channel region at the writing operation time, it is preferable that the channel width is made small. In order to effectively increase by the Joule heat the temperature of the metal oxide semiconductor layer 13 in the channel region, it is preferable to arrange the gate electrode such that the width of the region of the gate electrode 11 overlapped with the metal oxide semiconductor layer 13 is made small, that is, the channel length is small.

Further, the memory transistor Qm may not be the thin-film transistor, but may be a transistor of the MOS transistor structure having the metal oxide semiconductor layer 13 formed on the silicon substrate, for example.

Further, in each of the embodiments, it has been assumed that the first selection transistor Q1 and the second selection transistor Q2 have the same transistor structures as that of the memory transistor Qm. However, at least any one of the first selection transistor Q1 and the second selection transistor Q2 may be configured in the transistor structure different from that of the memory transistor Qm. For example, the first selection transistor Q1 and the second selection transistor Q2, in the case of the same thin-film transistors, may be composed of thin-film transistors other than the metal oxide semiconductors. Alternatively, the first selection transistor Q1 and the second selection transistor Q2 may be composed of transistors with the MOS transistor structure formed on the above silicon substrate. When the first and second selection transistors Q1 and Q2 have been formed on the silicon substrate, it is also preferable that the memory transistor Qm of the thin-film transistor is formed above the first and second selection transistors Q1 and Q2. The manufacturing process of the memory cell 1 can be simplified by forming each of the transistors Qm, Q1, and Q2 in the same transistor structure.

In each of the embodiments, the first selection transistor Q1 and the second selection transistor Q2 have been assumed as n-channel type transistors. However, the first selection transistor Q1 and the second selection transistor Q2 may be p-channel type transistors when necessary.

<2> In each of the embodiments, there has been assumed the case where the first selection transistor Q1 and the second selection transistor Q2 are thin-film transistors, and deterioration of the transistor characteristic due to the self heating deterioration phenomenon occurs at the writing operation time of the memory transistor Qm. However, when the first selection transistor Q1 and the second selection transistor Q2 are transistors with a possibility of generating certain deterioration in the transistor characteristic due to the writing current flowing at the writing operation time of the memory transistor Qm, the effect of the present invention can be also obtained in the transistor structure other than the thin-film transistors. That is, similarly to the memory cell 1 in each of the embodiments described above, by separately providing the first selection transistor Q1 and the second selection transistor Q2 and by distinctively using the first and second selection transistors Q1 and Q2 between the writing operation and the reading operation, it is possible to eliminate the influence of deterioration of the transistor characteristic generated in the first selection transistor Q1 by the writing operation and to perform the reading operation at a high speed with low power consumption. Further, since the first selection transistor Q1 can pass the writing current by permitting characteristic deterioration at the writing operation time, the problem of reduction in the writing characteristic of the memory cell transistor Qm can be also solved.

<3> In the configuration of the memory cell array 21 in the second embodiment, there has been exemplified the case where the reference voltage line VSL extends in the column direction. However, the disposition of the reference voltage line VSL is not limited to the disposition in the second embodiment, and the reference voltage line VSL can be also configured to extend in the row direction.

Further, flow of the writing current Idsp or the reading current Idsr in the memory cell 1 of the unselected column may be blocked by the following arrangement. The reference voltage line VSL extending in the column direction is provided in each column. A reference voltage line decoder is provided in place of the bit line decoder 24. A column selection is performed on the reference voltage line VSL side. A selected reference voltage line VSL is driven at the reference voltage Vss at the writing operation time and the reading operation time. The unselected reference voltage line VSL is in the floating state or is driven at the writing drain voltage Vdsp or at the reading drain voltage Vdsr.

<4> Further, in each of the embodiments, there has been assumed the case where the node N1 and the node N2 of the memory cell 1 are always applied with the same voltage and are handled as a single node. However, in the second embodiment and the like, when the writing operation and the reading operation become in the first and third voltage application state, by separately providing two reference voltage lines VSL for the writing operation and the reading operation, the node N1 of each memory cell 1 may be connected to the reference voltage line VSL for the writing operation, and the node N2 of each memory cell 1 may be connected to the reference voltage line VSL for the reading operation. Further, when the writing operation and the reading operation become in the second and fourth voltage application states, by separately providing two bit lines BL in each column for the writing operation and the reading operation, the node N1 of the memory cell 1 of each column may be connected to the bit line BL for the writing operation, and the node N2 of the memory cell 1 of each column may be connected to the bit line BL for the reading operation.

<5> In the second to fifth embodiments, the memory gate line MGL and the first word line WPL in the same row may be set common to one control signal line. In this case, at the writing operation time, the first writing gate voltage Vgp1 and the second writing gate voltage Vgp2 become the same voltages, and at the reading operation time, the first reading gate voltage Vgr1 and the second reading gate voltage Vgr2 become the same voltages. Therefore, in the first voltage application state of the writing operation, Vgp1>Vn3+Vthm is applied to the memory transistor Qm. Accordingly, when Vthm=Vth1 is applied to the first selection transistor Q1, Expression 3 is not established. Consequently, the first selection transistor Q1 needs to be operated in the linear region. Further, in the second voltage application state of the writing operation, Vgp2>Vn3+Vth1 is applied to the first selection transistor Q1. Accordingly, when Vthm=Vth1 is applied to the memory transistor Qm, Expression 6 is not established. Consequently, the memory transistor Qm needs to be operated in the linear region. In the reading state, the memory transistor Qm and the first selection transistor Q1 in the first state are controlled to be in the OFF state. Therefore, there occurs no problem by setting the memory gate line MGL and the first word line WPL in the same row to one common control signal line.

<6> In the second to fifth embodiments, it is sufficient that the present memory devices 20 to 50 respectively have the memory cell arrays 21, 31, 41, and 51 including the memory cell 1 illustrated in FIG. 1. The configurations of the peripheral circuits other than the memory cell arrays 21, 31, 41, and 51 can be appropriately changed, and are not limited to the configurations of the above embodiments. The liquid crystal display device 70 according to the seventh embodiment may also include a non-volatile memory device configured to include the memory cell 1 illustrated in FIG. 1. A circuit configuration of the liquid crystal display device 70 itself and a circuit configuration of the non-volatile memory device are not limited to the configurations in each of the above embodiments.

INDUSTRIAL APPLICABILITY

The present invention can be utilized in a non-volatile memory device, a data processing device, a logic circuit device, a display device, and the like each including memory cells capable of holding information in a non-volatile manner.

DESCRIPTION OF SYMBOLS 1 memory cell
2 circuit cell
10 substrate
11 gate electrode
12 gate insulation film
13 metal oxide semiconductor
14 source electrode
15 drain electrode
16 channel etching stopper layer
16a contact opening formation region
17 passivation layer
18 insulation material layer (oxygen absorbing layer)
19 insulation film
20, 30, 40, 50 non-volatile memory device
21, 31, 41, 51 memory cell array
22, 32, 42, 52 control circuit
23, 33, 43, 53 voltage generation circuit
24, 34 bit line decoder
25, 45, 55 word line decoder
26, 46 memory gate control circuit
27, 37, 47, 57 sense amplifier circuit
60a, 60b, 60c non-volatile memory device
61 shared memory control circuit unit
70 liquid crystal display device
71 active matrix substrate
72 common electrode
73 display control circuit
74 common electrode driving circuit
75 source driver
76 gate driver
77 CS driver
80 pixel circuit
81 thin-film transistor
82 liquid crystal capacitor
83 auxiliary capacitor
90 contact opening formation region
91 contact opening
BL, BL1 to BLn bit line
CSL, CSL1 to CSLj auxiliary capacitor line of liquid crystal display device
GL, GL1 to GLj gate line of liquid crystal display device
MGL, MGL1 to MGLm memory gate line
N0, N1, N2 node of memory cell
N3 internal node of memory cell
NC0, NC1, NC2 control node of memory cell
Q1 first selection transistor
Q2 second selection transistor
Qm memory transistor
Q memory transistor, first and second selection transistors
RDL1 to RDLm reading data line
SL, SL1 to SLk source line of liquid crystal display device
VSL reference voltage line
WPL, WPL1 to WPLm first word line
WRL, WRL1 to WRLm second word line

The invention claimed is:

1. A non-volatile memory device comprising one or more memory cells, wherein
each of the memory cells comprises a memory transistor, a first selection transistor, and a second selection transistor, and a source and a drain of the memory transistor, a source or a drain of the first selection transistor, and a source or a drain of the second selection transistor are electrically connected to one another to form an internal node of each memory cell,
the memory transistor comprises a transistor structure having a gate electrode, a source region, a drain region, and a channel region, each region being composed a metal oxide semiconductor,
the memory transistor holds in a non-volatile manner any one of a first state in which a current/voltage characteristic between the source region and the drain region changes depending on a voltage application state of the gate electrode and a second state in which a current/voltage characteristic between the source region and the drain region indicates an ohmic resistance characteristic regardless of a voltage application state of the gate electrode, and
the memory transistor has a state transition characteristic which transits from the first state to the second state depending on a current flowing between the source and the drain,
the non-volatile memory device is configured so that at a writing operation time of transiting the memory transistor from the first state to the second state, a conducting state is set between the source and the drain of the first selection transistor, a non-conducting state is set between the source and the drain of the second selection transistor, and a writing current flows in the memory transistor and the first selection transistor, and
the non-volatile memory device is configured so that at a reading operation time of detecting whether the memory transistor is in the first state or the second state, a non-conducting state is set between the source and the drain of the first selection transistor, a conducting state is set between the source and the drain of the second selection transistor, and a reading voltage is applied between the source and the drain of the memory transistor.

2. The non-volatile memory device according to claim 1, wherein at least one of the first selection transistor and the second selection transistor comprises the same transistor structure as that of the memory transistor.

3. The non-volatile memory device according to claim 1, wherein transition from the first state to the second state occurs based on a change in a configuration proportion of elements that configure the metal oxide semiconductor of the channel region by Joule heat generated by a current flowing between the source region and the drain region of the memory transistor.

4. The non-volatile memory device according to claim 1, wherein at the writing operation time, a voltage between the source and the drain of the memory transistor is larger than a voltage between the source and the drain of the first selection transistor.

5. The non-volatile memory device according to claim 1, wherein the metal oxide semiconductor is formed by containing In, Ga or Zn element.

6. The non-volatile memory device according to claim 1, wherein the memory transistor and the first and second selection transistors are thin-film transistors.

7. The non-volatile memory device according to claim 1, wherein the first and second selection transistors comprise same transistor structures as that of the memory transistor, and are fixed to the first state.

8. The non-volatile memory device according to claim 1, wherein, at the reading operation time, a voltage applied to the gate electrode of the memory transistor is set such that a current that flows between the source region and the drain region in a case of the memory transistor being in the first state is smaller than a current that flows between the source region and the drain region in a case of the memory transistor being in the second state.

9. The non-volatile memory device according to claim 1, wherein in the memory cell in which the memory transistor is in the first state, a conducting state is set between the source and the drain of the memory transistor, a non-conducting state is set between the source and the drain of the first selection transistor, and an output voltage corresponding to a voltage applied to a gate electrode of the second selection transistor is output from the internal node.

10. The non-volatile memory device according to claim 1, further comprising a memory cell array including a plurality of the memory cells arranged in at least a column direction of a row direction and the column direction, and in each of the plurality of the memory cells arranged on the same column, the source or drain, which is not connected to the first and second selection transistors, of the memory transistor is connected in common to a data signal line extending in the column direction, the source or drain, which is not connected to the memory transistor, of the first selection transistor is connected to a first reference voltage line, and the source or drain, which is not connected to the memory transistor, of the second selection transistor is connected to a second reference voltage line.

11. The non-volatile memory device according to claim 1, further comprising a memory cell array including a plurality of the memory cells arranged in at least a row direction of the row direction and the column direction, and in each of the plurality of the memory cells arranged on the same row, the gate electrode of the memory transistor is connected in common to a first control line extending in the row direction, the gate electrode of the first selection transistor is connected in common to a second control line extending in the row direction, the gate electrode of the second selection transistor is connected in common to a third control line extending in the row direction, the source or drain, which is not connected to the memory transistor, of the first selection transistor is connected in common to a first reference voltage line, and the source or drain, which is not connected to the memory transistor, of the second selection transistor is connected in common to a second reference voltage line.

12. The non-volatile memory device according to claim 10, wherein first control lines of respective rows to each of which the gate electrode of the memory transistor is connected are connected to one another.

13. The non-volatile memory device according to claim 10, wherein first control lines of respective rows to each of which the gate electrode of the memory transistor is connected are connected to one another, and the third control lines of respective rows to each of which the gate electrode of the second selection transistor is connected are connected to one another.

14. The non-volatile memory device according to claim 11, wherein the first control line and the second control line connected to the memory cells of the same row are same control signal line.

15. The non-volatile memory device according to claim 10, wherein the first reference voltage line and the second reference voltage line are same reference voltage line.

* * * * *